US012684275B2

(12) United States Patent
Kim et al.

(10) Patent No.: US 12,684,275 B2
(45) Date of Patent: Jul. 14, 2026

(54) DISPLAY DEVICE

(71) Applicant: LG ELECTRONICS INC., Seoul (KR)

(72) Inventors: Jingyu Kim, Seoul (KR); Kwaneun Jin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 258 days.

(21) Appl. No.: 18/549,872

(22) PCT Filed: Jun. 1, 2021

(86) PCT No.: PCT/KR2021/006796
§ 371 (c)(1),
(2) Date: Sep. 8, 2023

(87) PCT Pub. No.: WO2022/255505
PCT Pub. Date: Dec. 8, 2022

(65) Prior Publication Data
US 2024/0164037 A1     May 16, 2024

(51) Int. Cl.
*H04R 1/02*        (2006.01)
*H05K 5/03*        (2006.01)
(52) U.S. Cl.
CPC .............. *H04R 1/028* (2013.01); *H05K 5/03* (2013.01); *H04R 2499/15* (2013.01)
(58) Field of Classification Search
None
See application file for complete search history.

(56) References Cited

U.S. PATENT DOCUMENTS 7,522,159 B2 * 4/2009 Miyata ................... H10D 86/00
                                                        345/204
2009/0225239 A1 * 9/2009 Osada .................... H04R 1/028
                                                        348/841
(Continued)

FOREIGN PATENT DOCUMENTS

KR        10-0625777        9/2006
KR     10-2010-0123009      11/2010
(Continued)

OTHER PUBLICATIONS

Kim et al (KR 101014425 B1) (Year: 2011).*
(Continued)

*Primary Examiner* — Hung S. Bui
*Assistant Examiner* — Elisa Sasserath
(74) *Attorney, Agent, or Firm* — LEE, HONG, DEGERMAN, KANG & WAIMEY

(57)        ABSTRACT

A display device is disclosed. The display device of the present disclosure comprises: a display panel; a frame to which the display panel is coupled; a speaker located adjacent to the display panel; and a cover assembly located in front of the display panel and the speaker, wherein the cover assembly comprises: a cover body which is movably coupled to the frame; and a cover which covers the front portion of the cover body. The cover body comprises: a first body hole formed through the cover body; and a second body hole which is formed through the cover body and is spaced apart from the first body hole in the direction in which the cover body moves. In addition, the speaker faces the first body hole or the second body hole.

15 Claims, 28 Drawing Sheets

(56)        References Cited

U.S. PATENT DOCUMENTS

2015/0055027 A1 * 2/2015 Suzuki .................. H04N 5/642
                                                           348/794
2019/0227591 A1 * 7/2019 Youn ................... H04R 1/2834
2021/0136313 A1 * 5/2021 Li ........................... H04R 1/26

FOREIGN PATENT DOCUMENTS

| KR | 10-1014425 | 2/2011 | |
| KR | 101014425 B1 * | 2/2011 | ....... G02F 1/133308 |
| KR | 10-2020-0114329 | 10/2020 | |
| KR | 20200114329 A * | 10/2020 | ........... H05K 5/0217 |

OTHER PUBLICATIONS

Kang et al (KR 20200114329 A) (Year: 2020).*
PCT International Application No. PCT/KR2021/006796, International Search Report dated Feb. 21, 2022, 4 pages.

* cited by examiner

[FIG. 1]
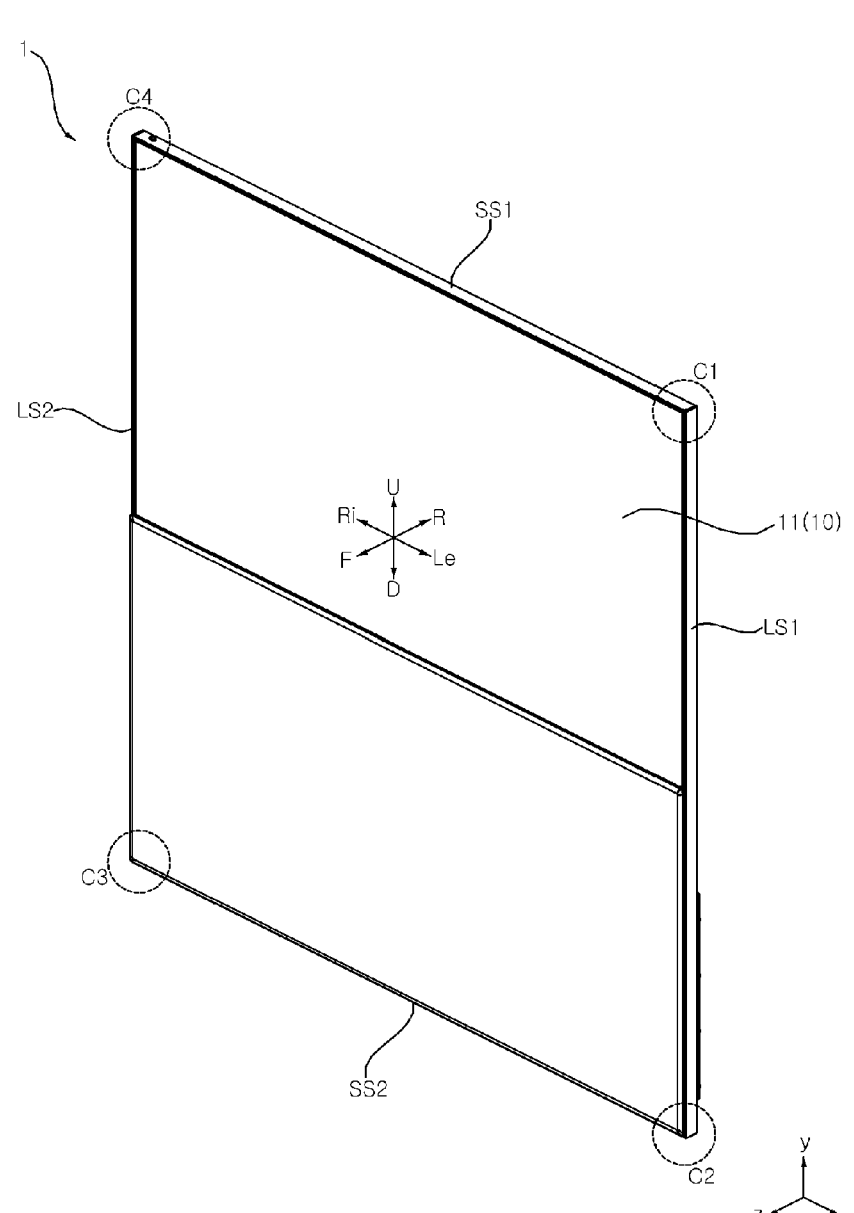

[FIG. 2]
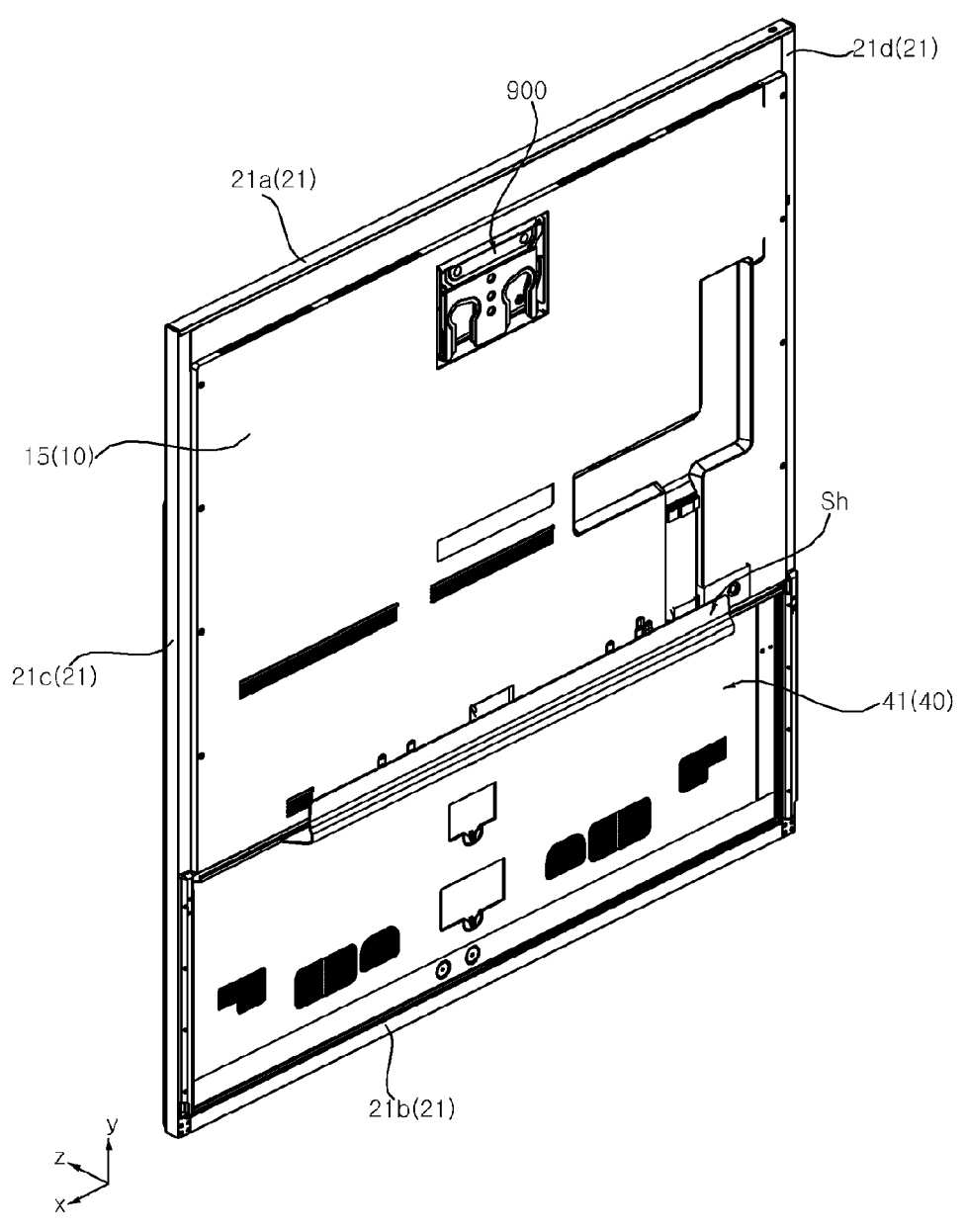

[FIG. 3]
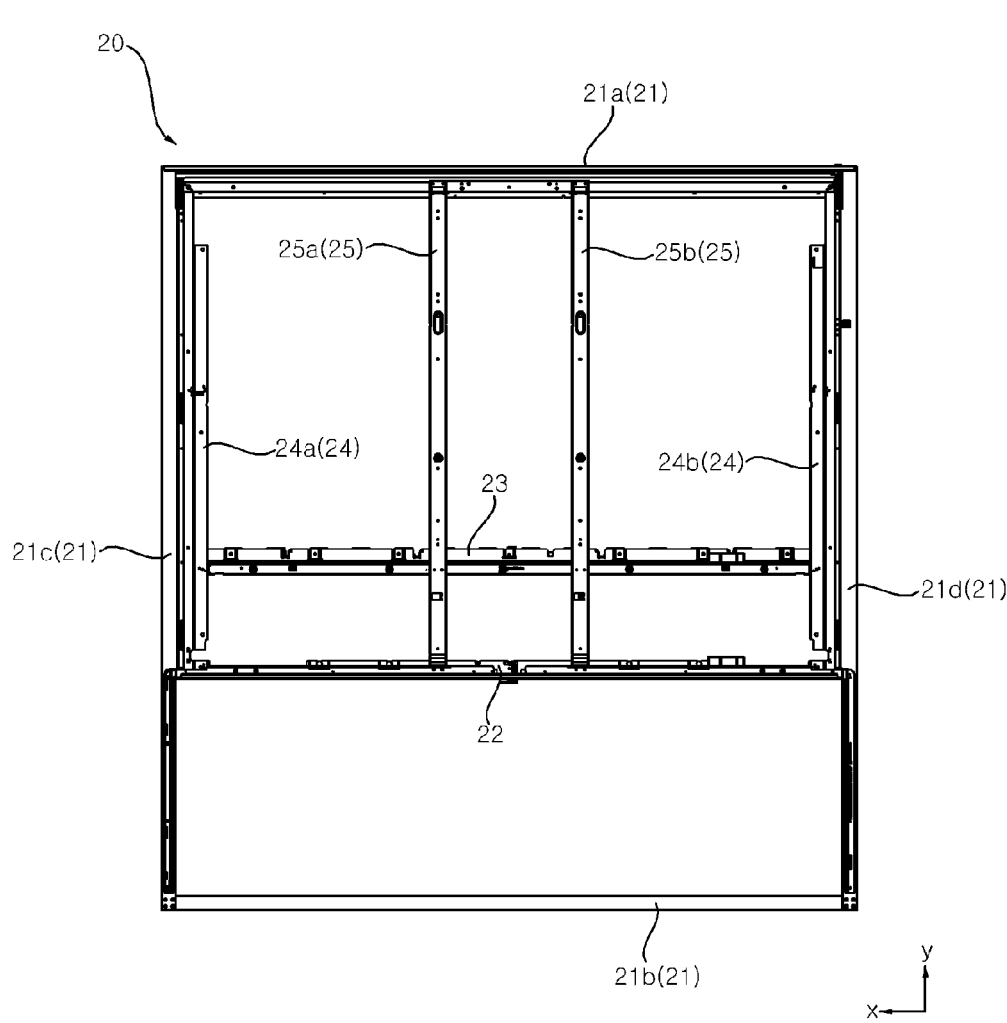

[FIG. 4]
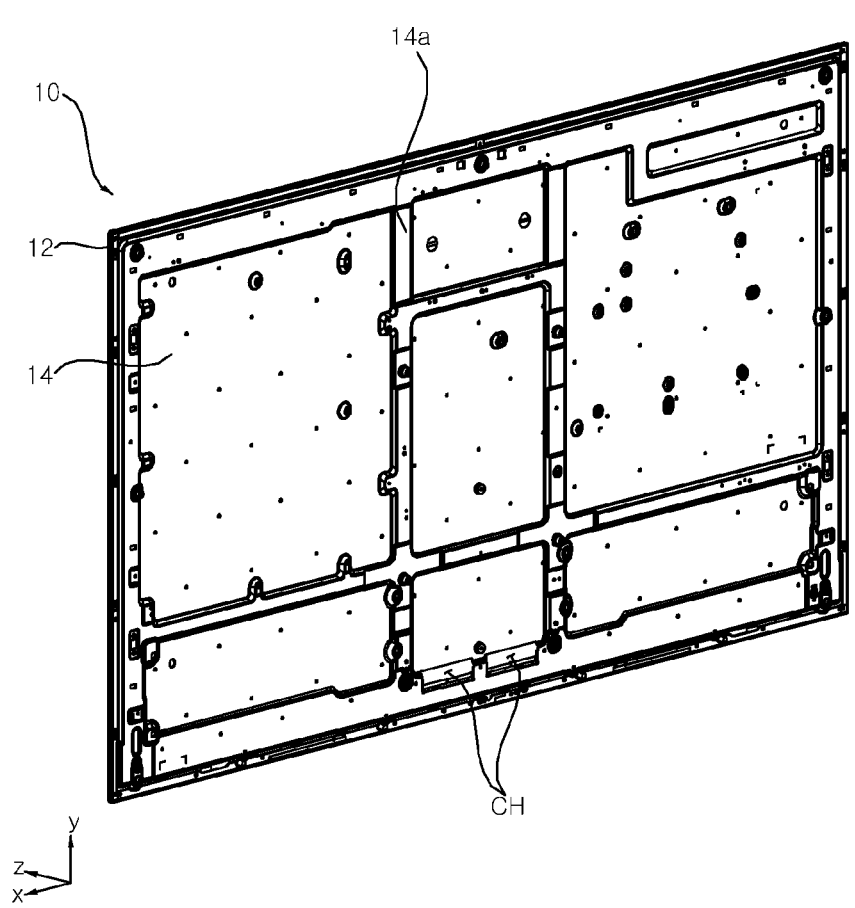

[FIG. 5]
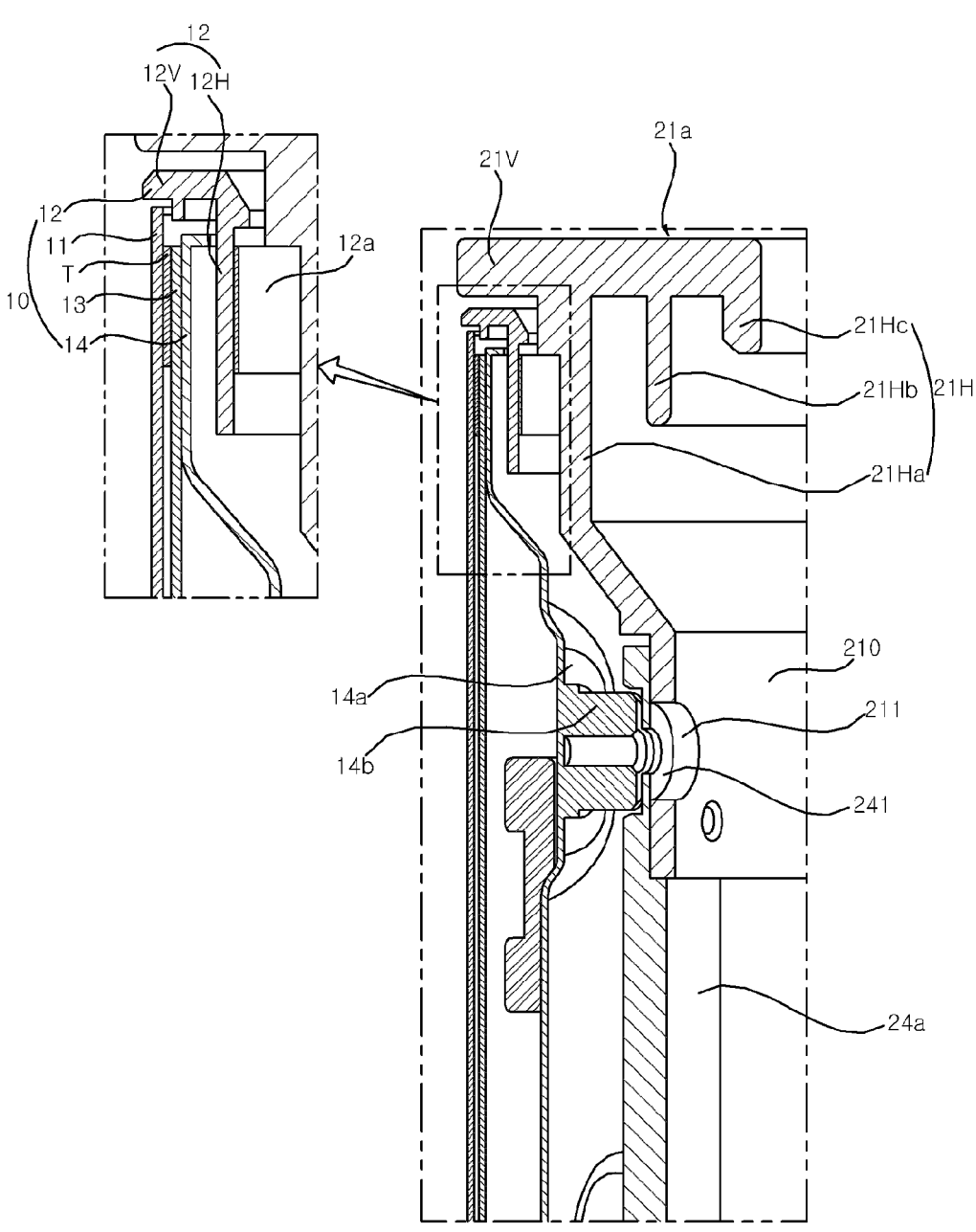

[FIG. 6]
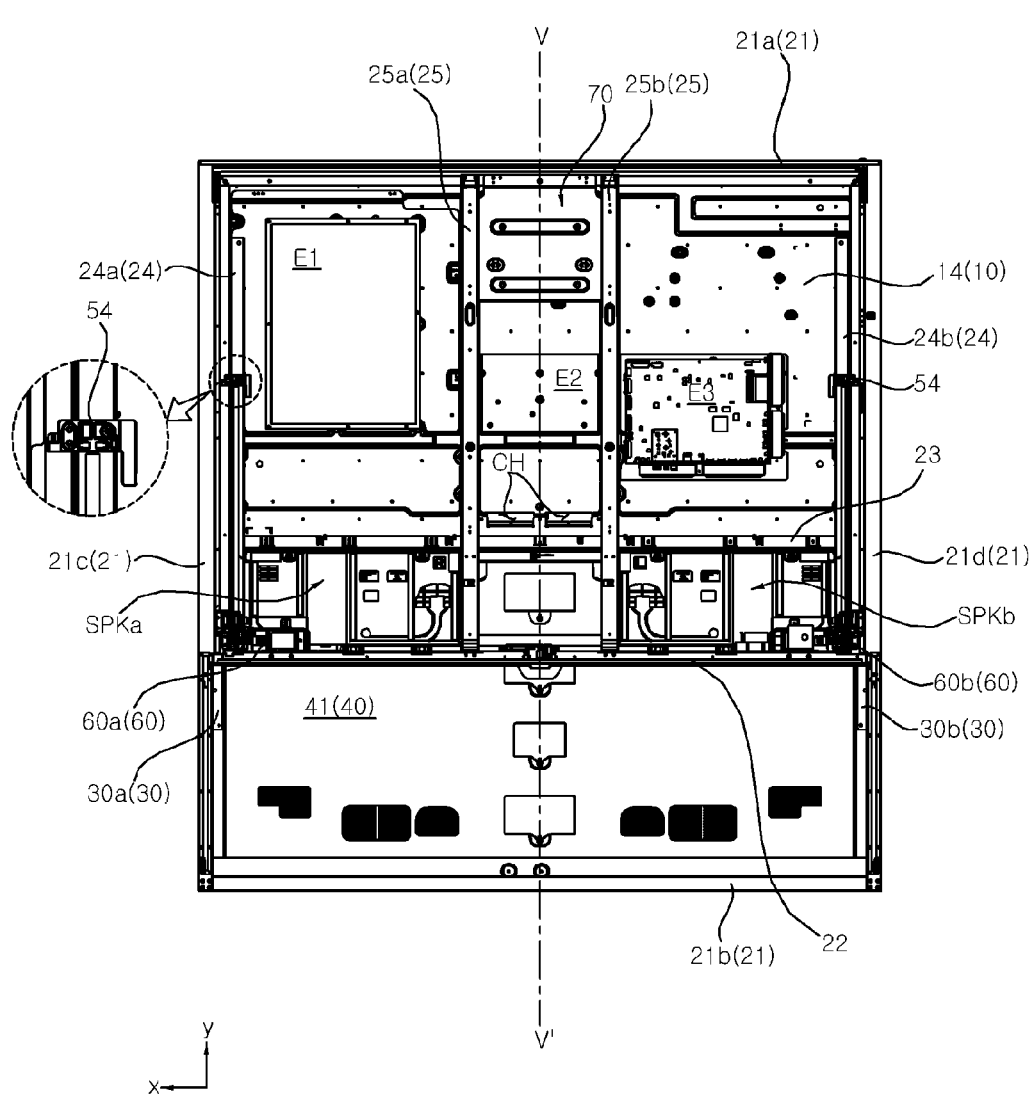

[FIG. 7]
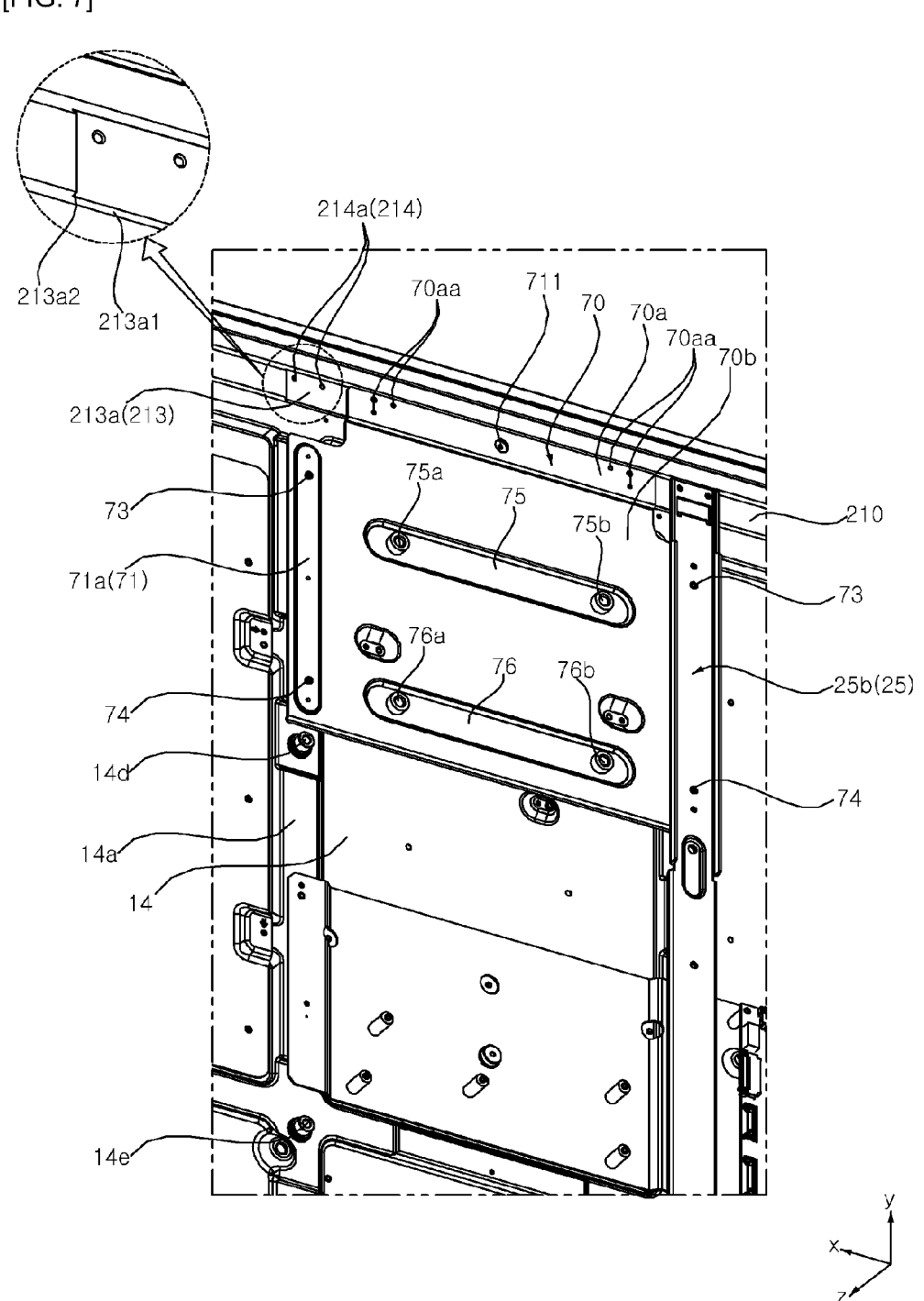

[FIG. 8]
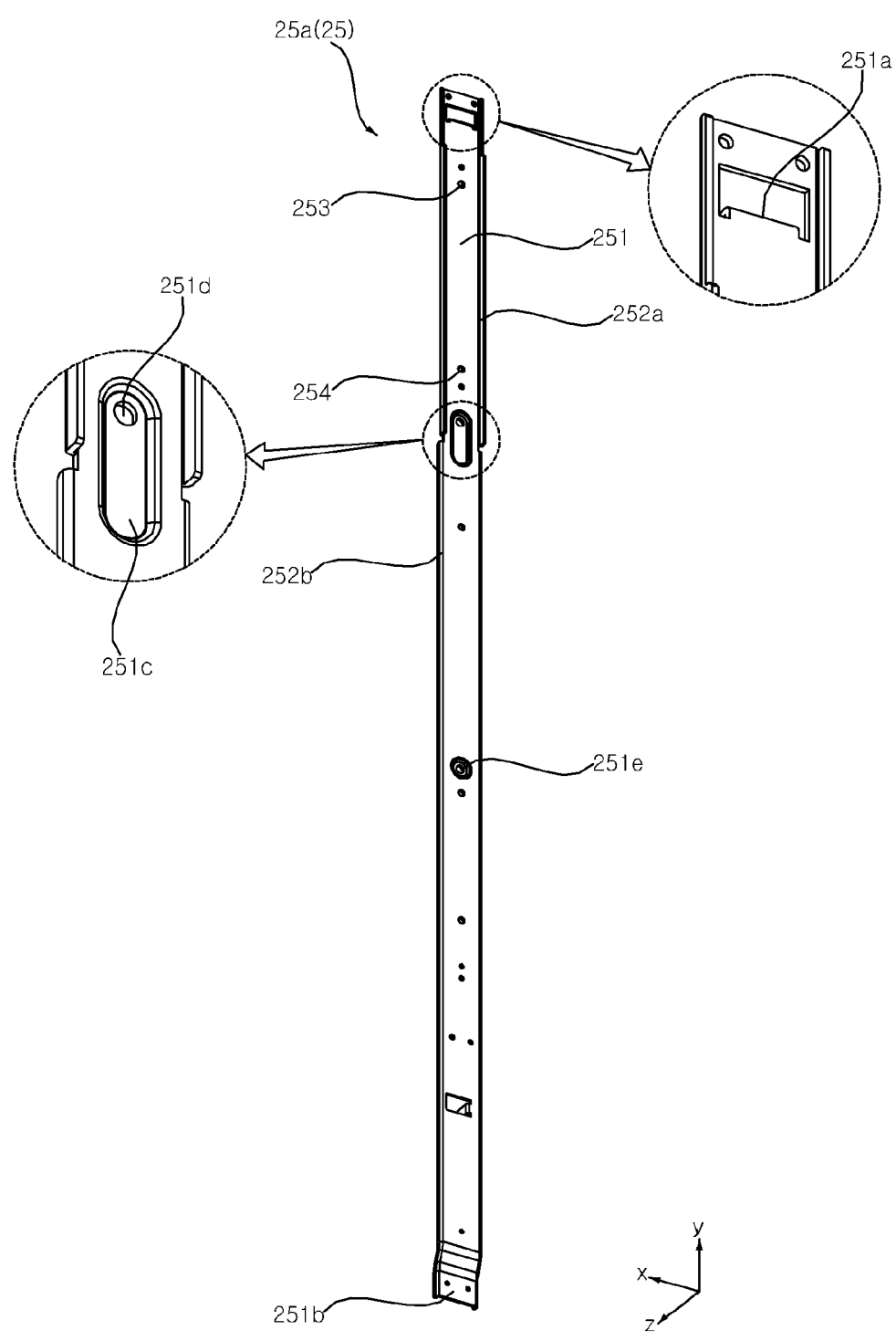

[FIG. 9]
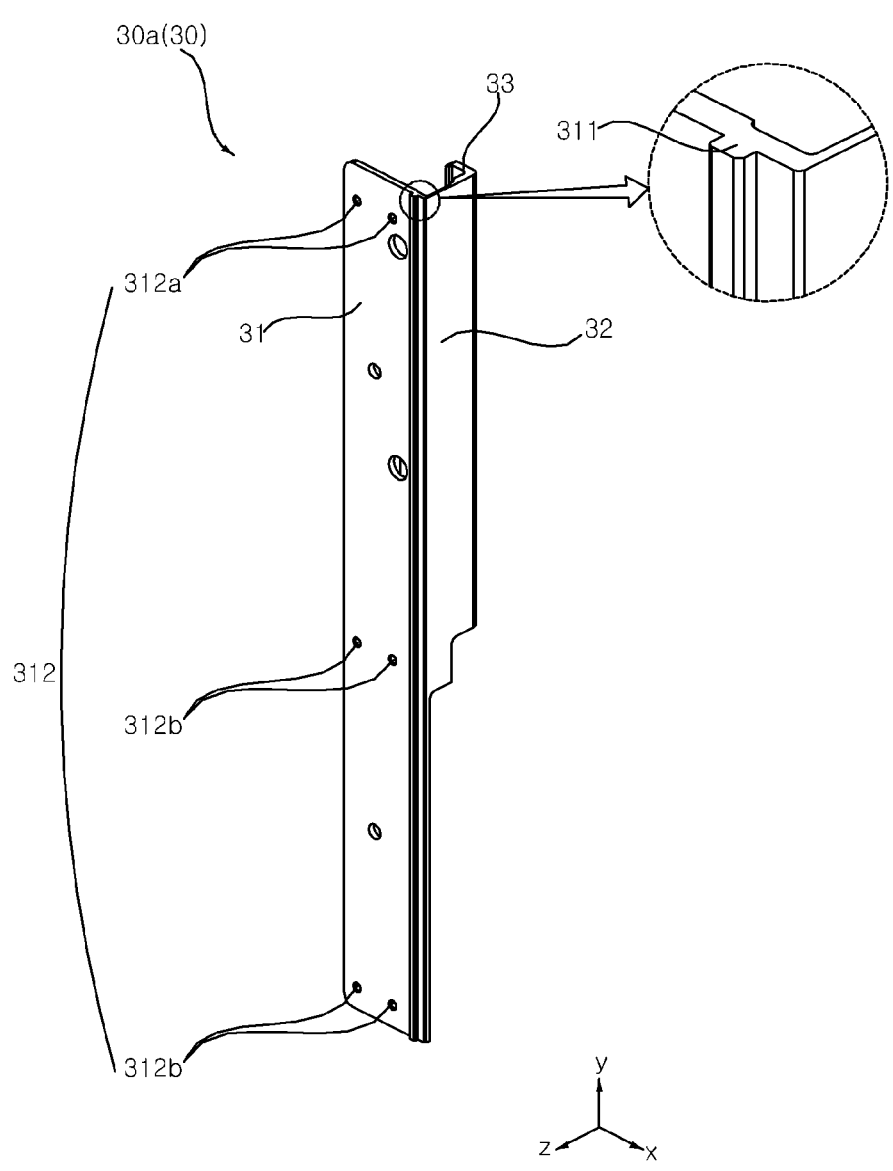

[FIG. 10]
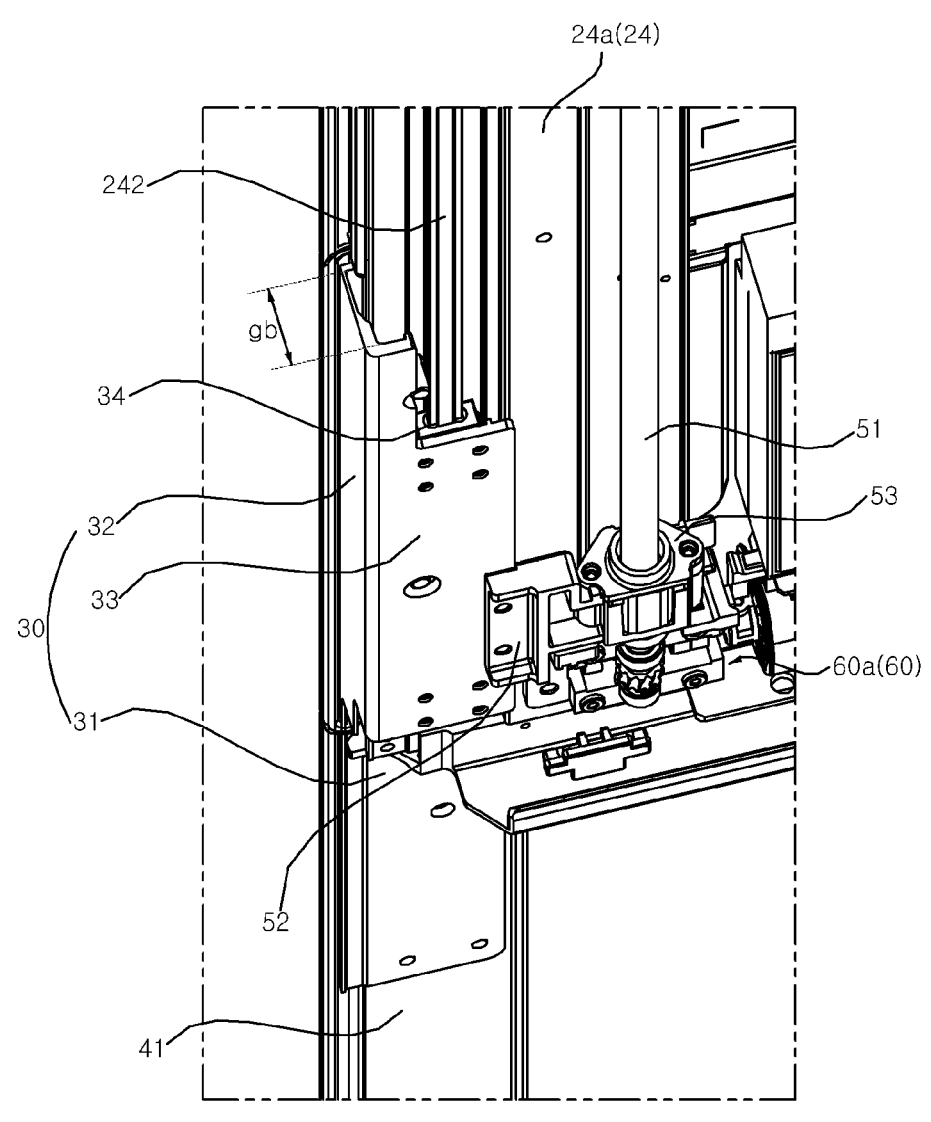

[FIG. 11]
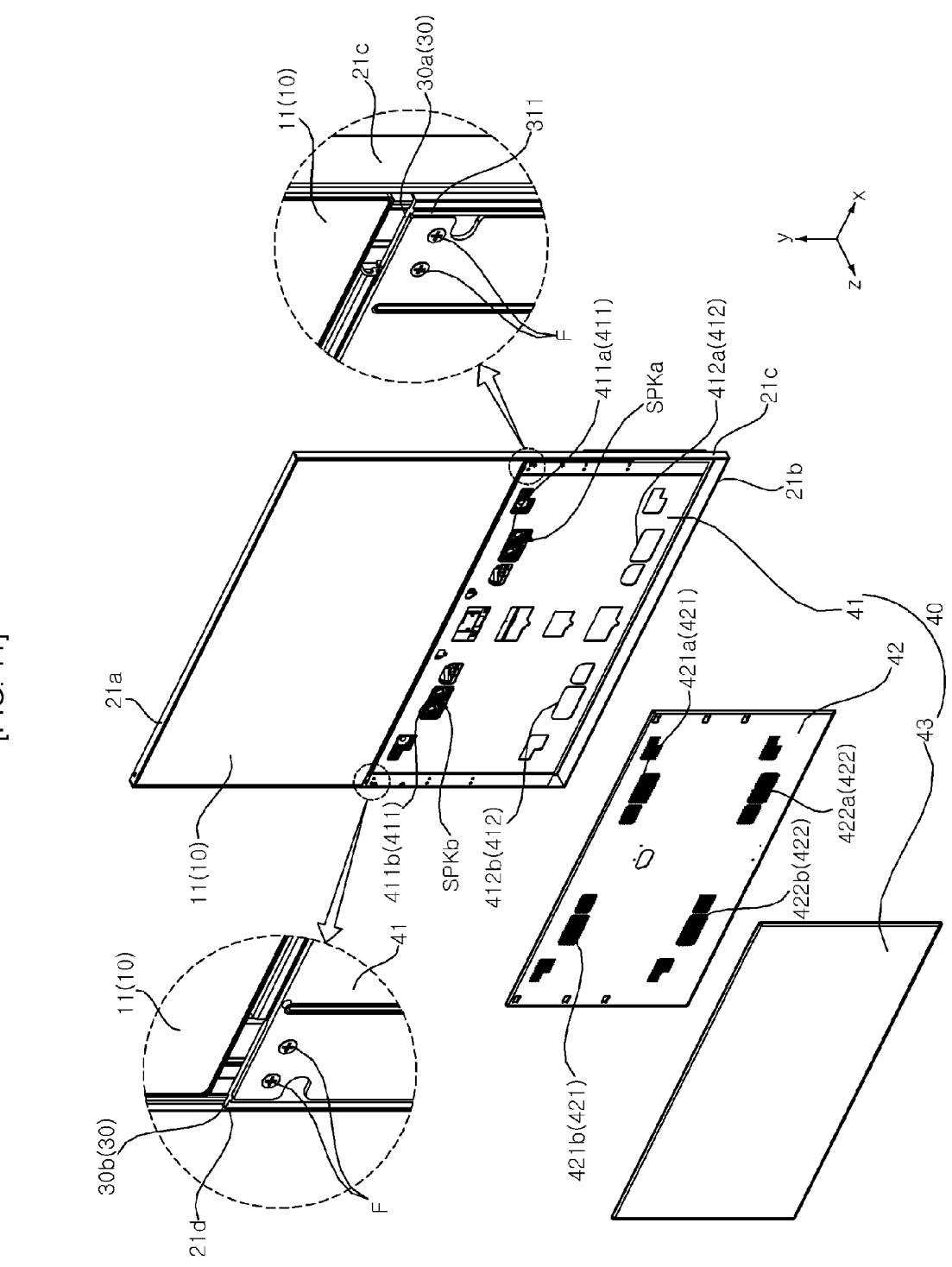

[FIG. 12]
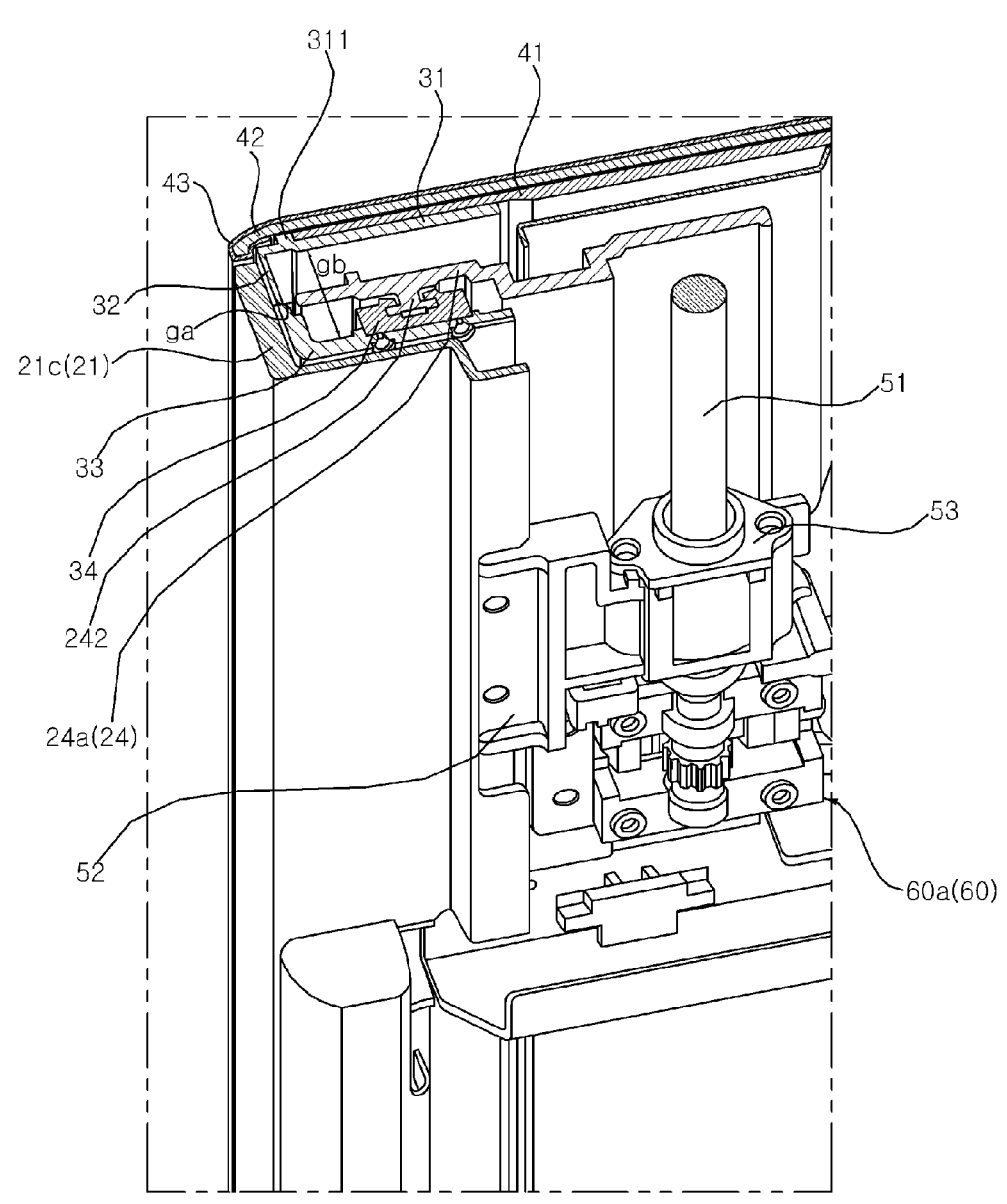

[FIG. 13]
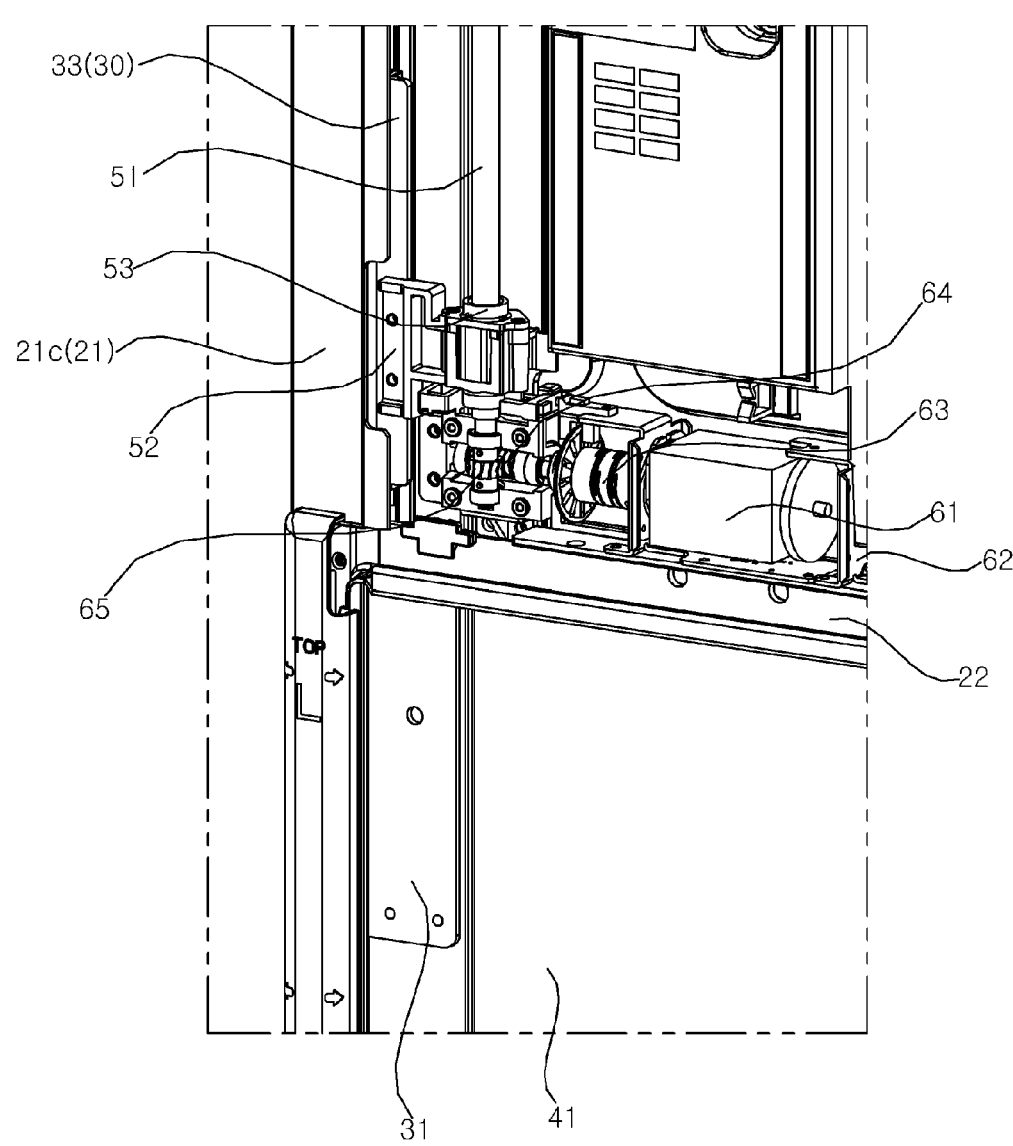

[FIG. 14]
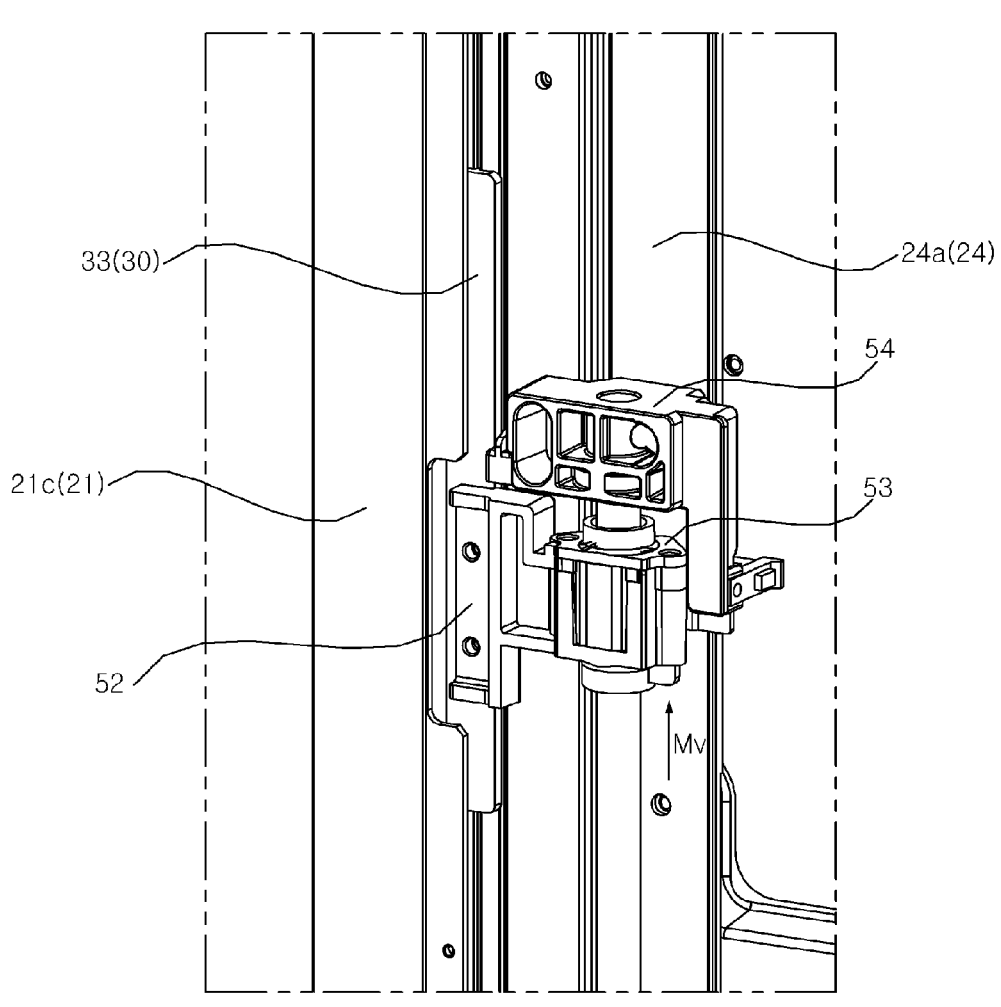

[FIG. 15]
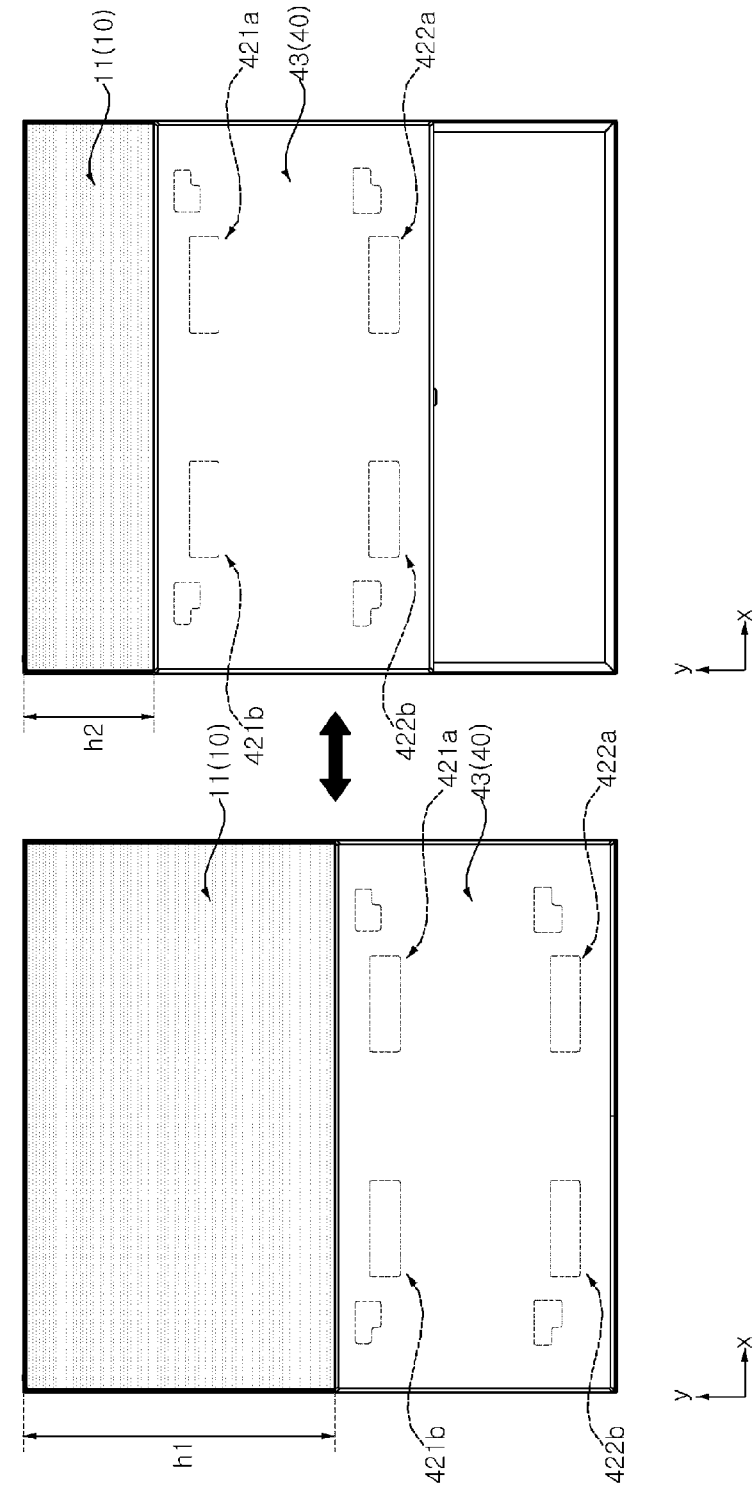

[FIG. 16]
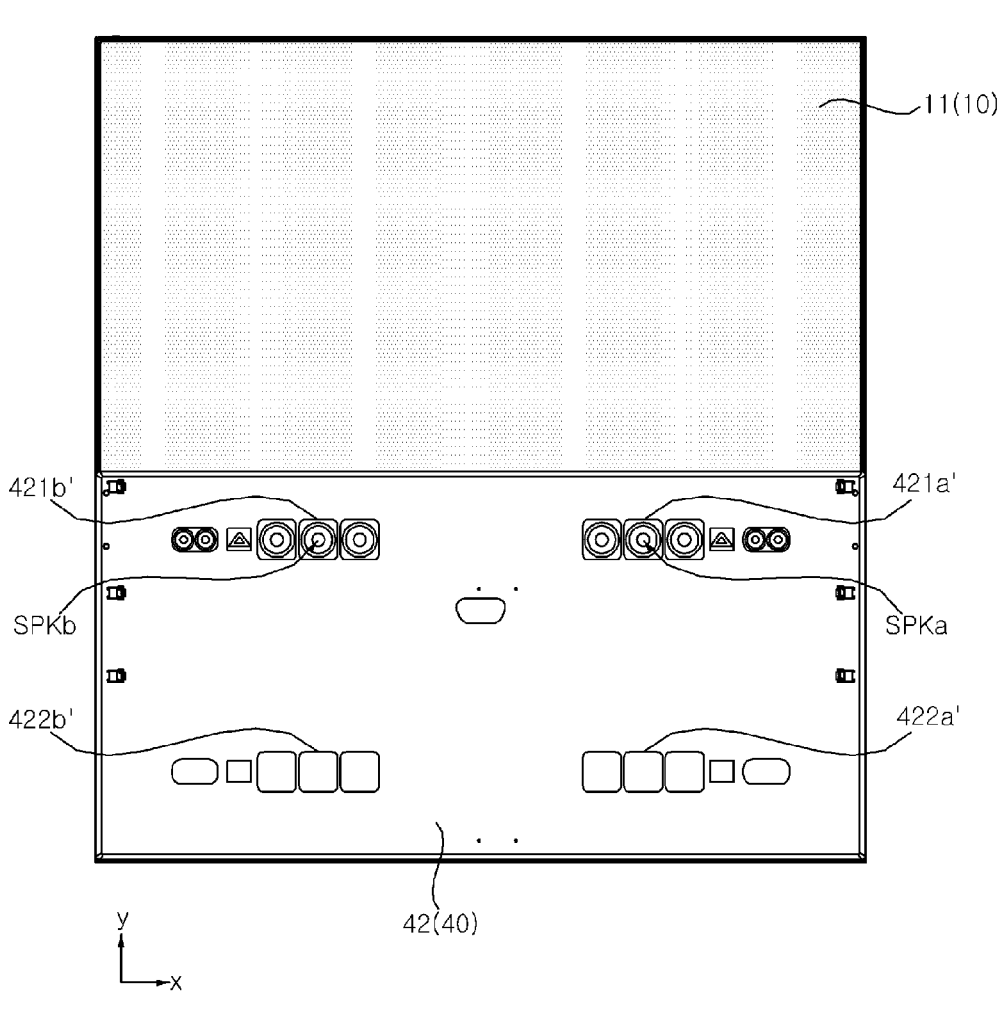

[FIG. 17]
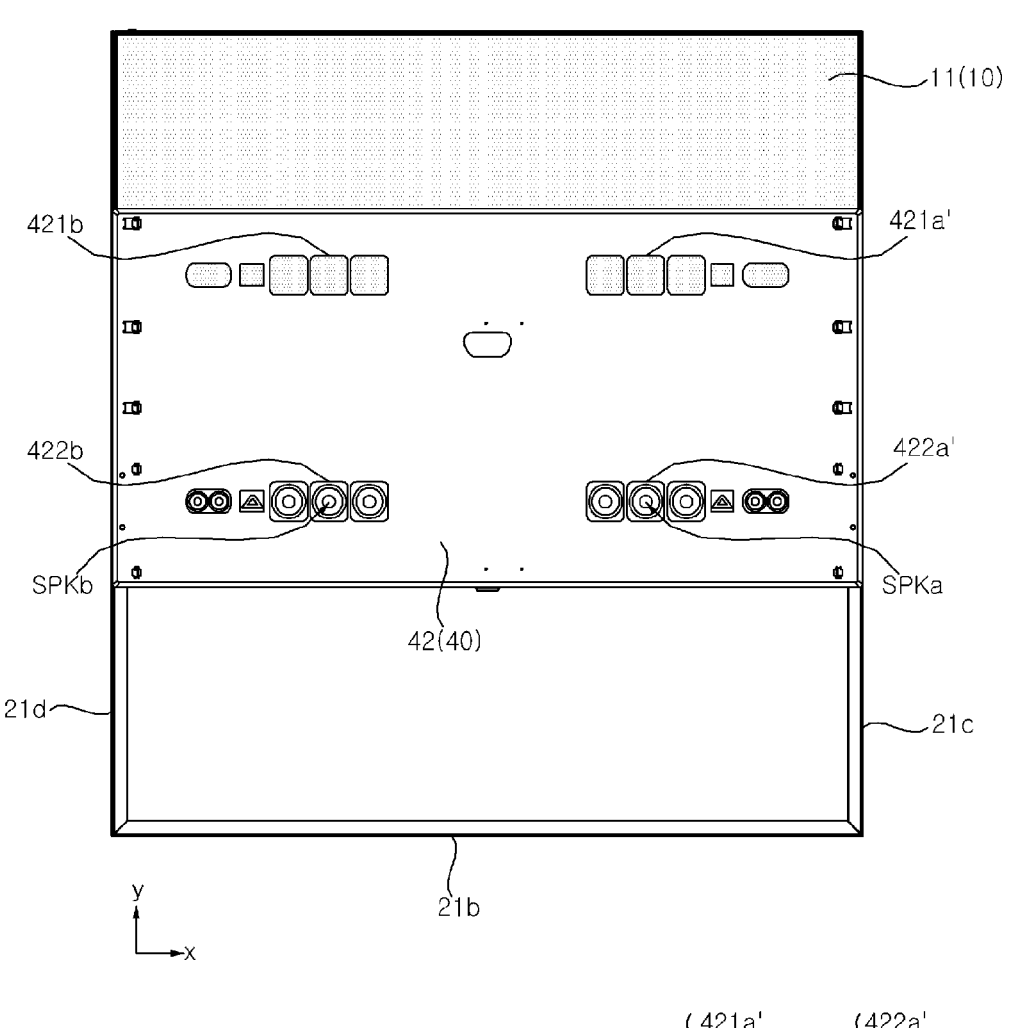

[FIG. 20]
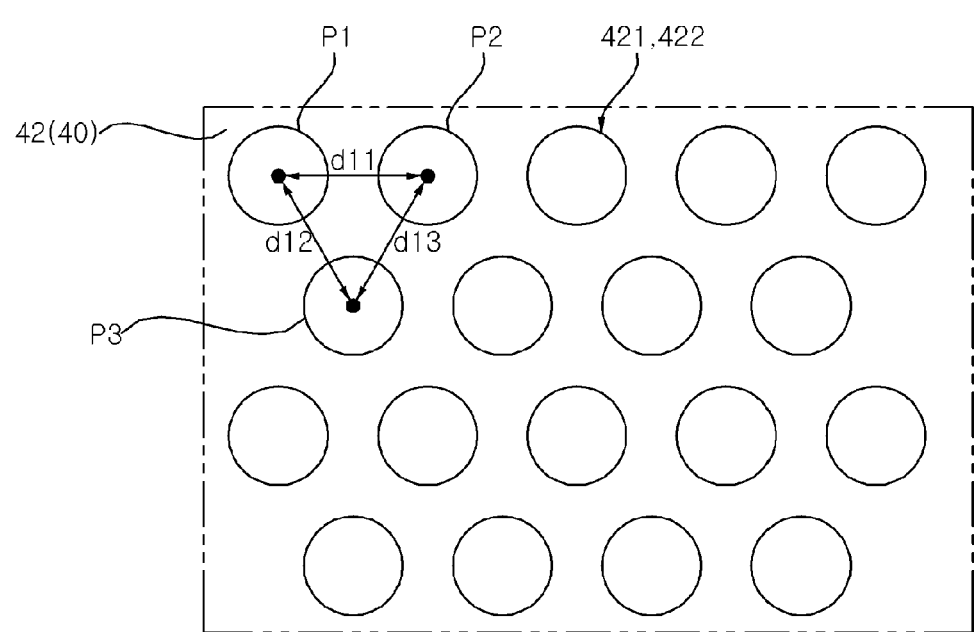

[FIG. 21]
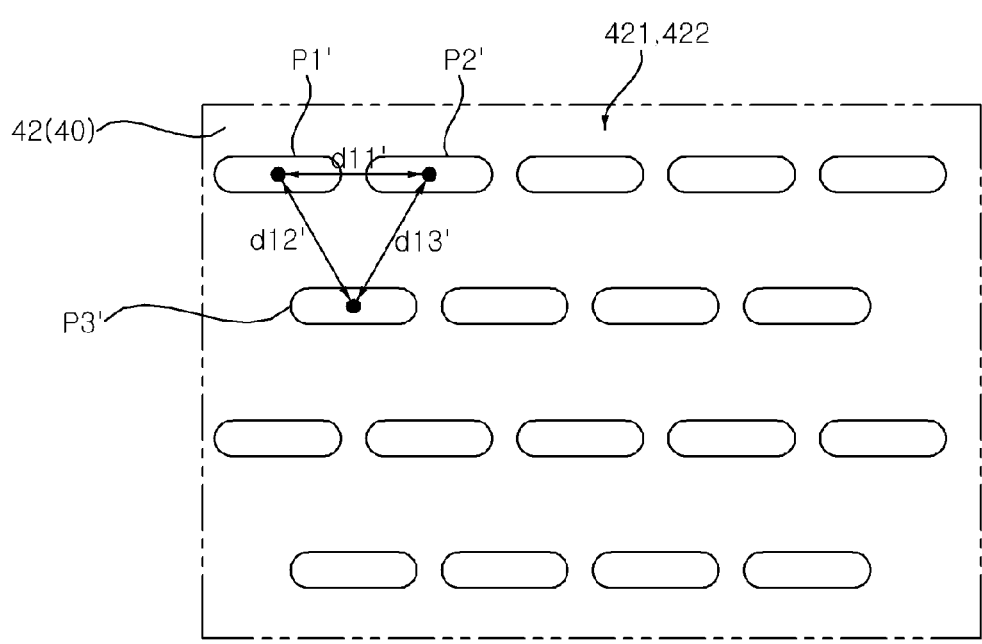

[FIG. 22]
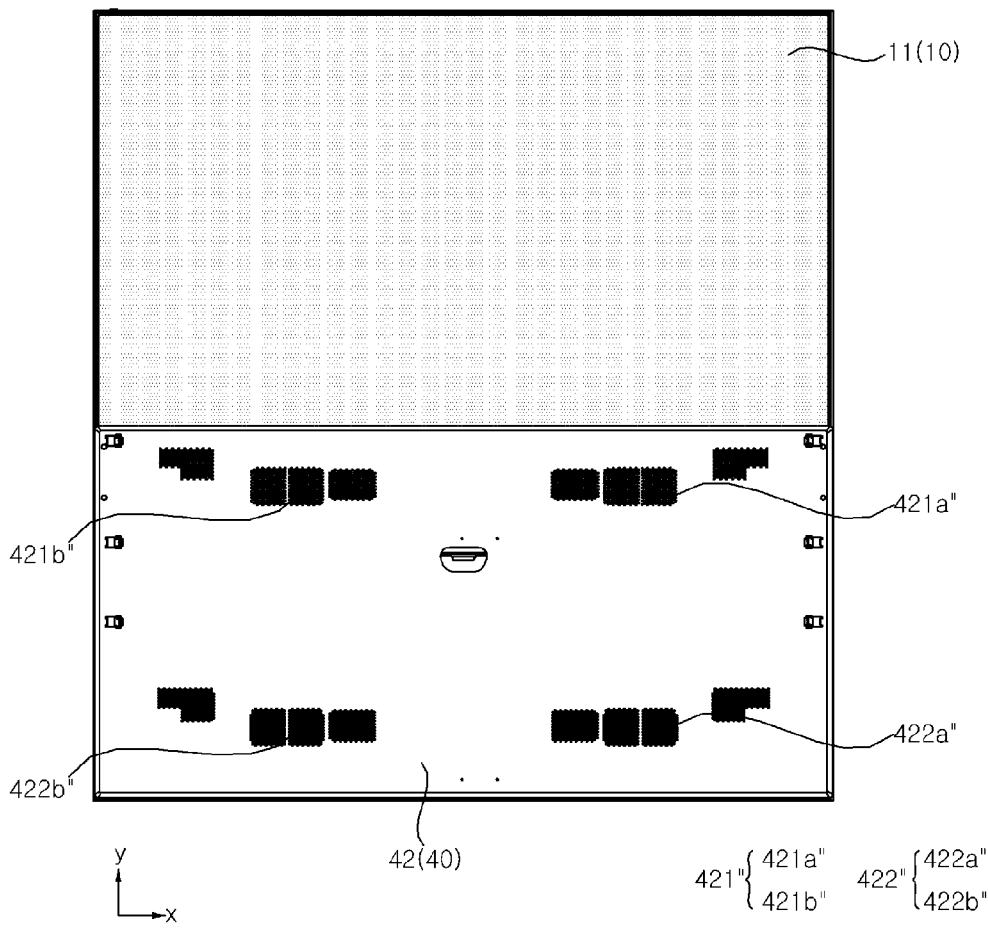

[FIG. 23]
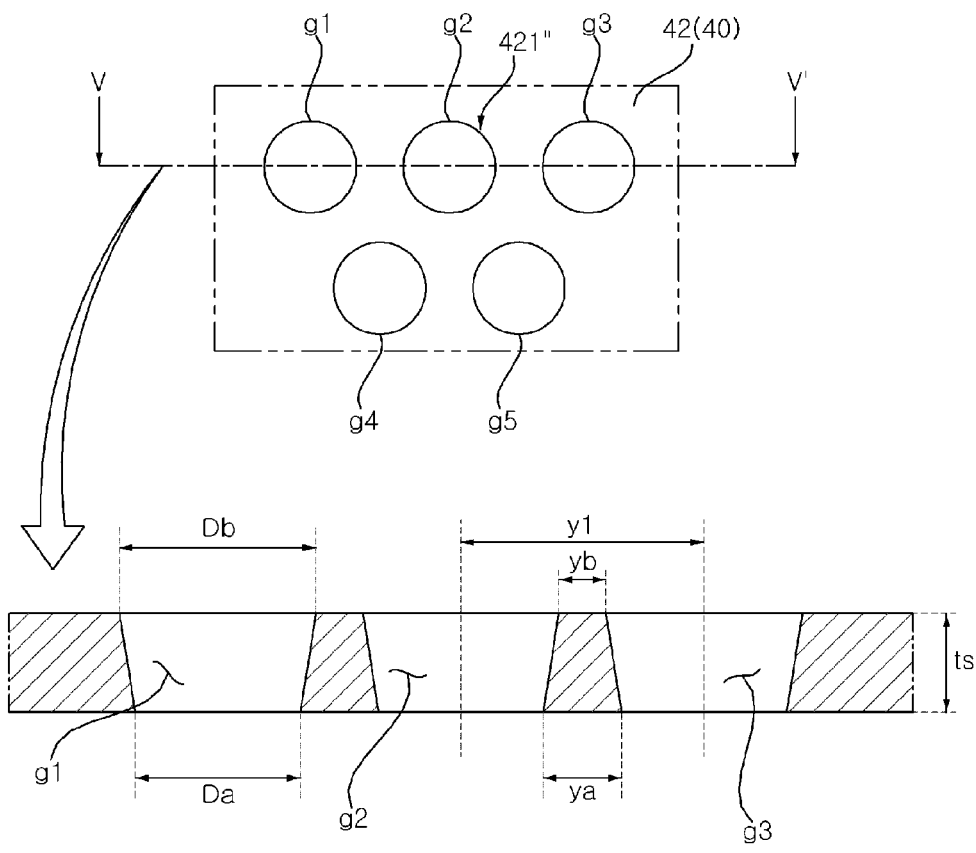

[FIG. 24]
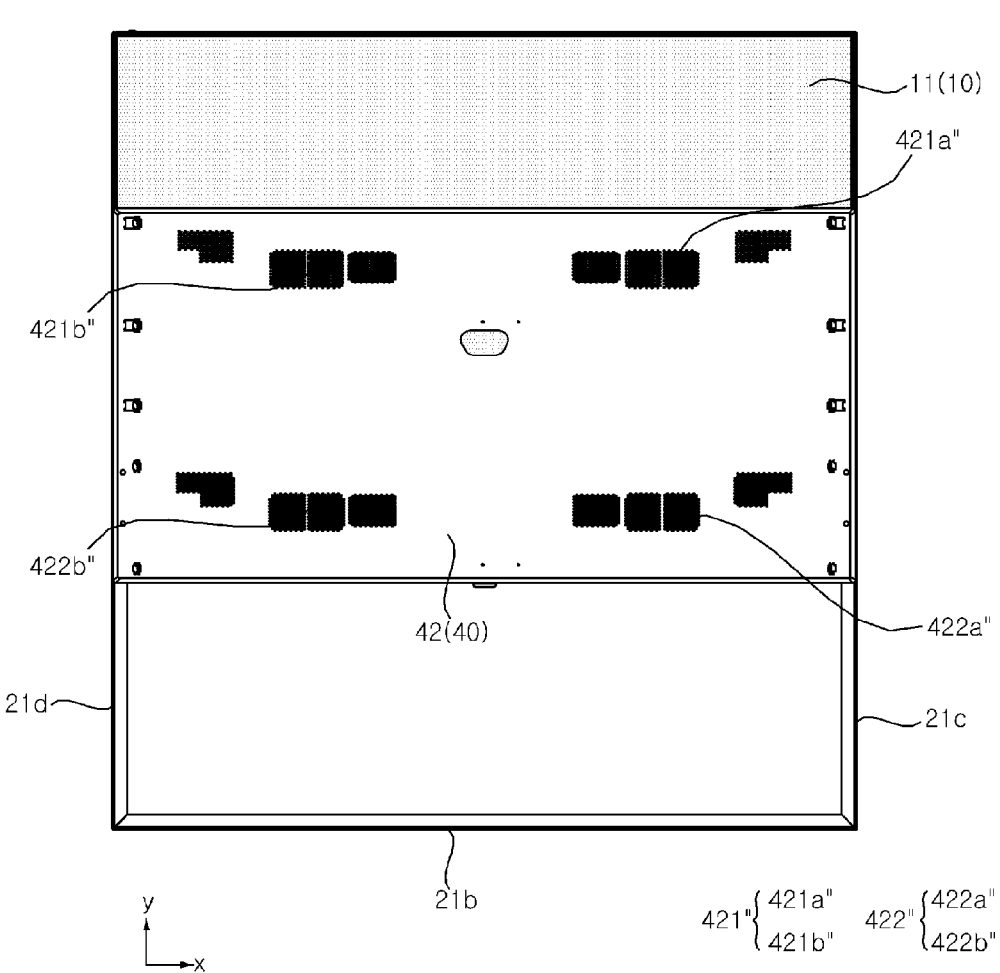

[FIG. 25]
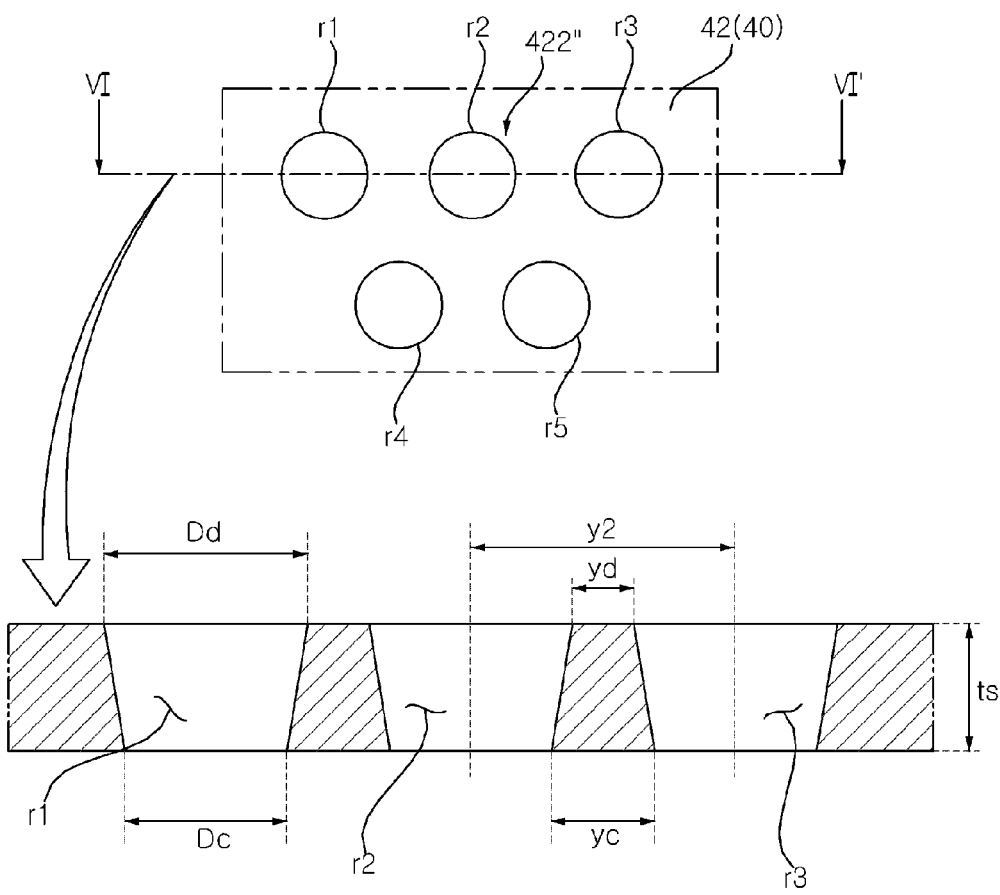

[FIG. 26]
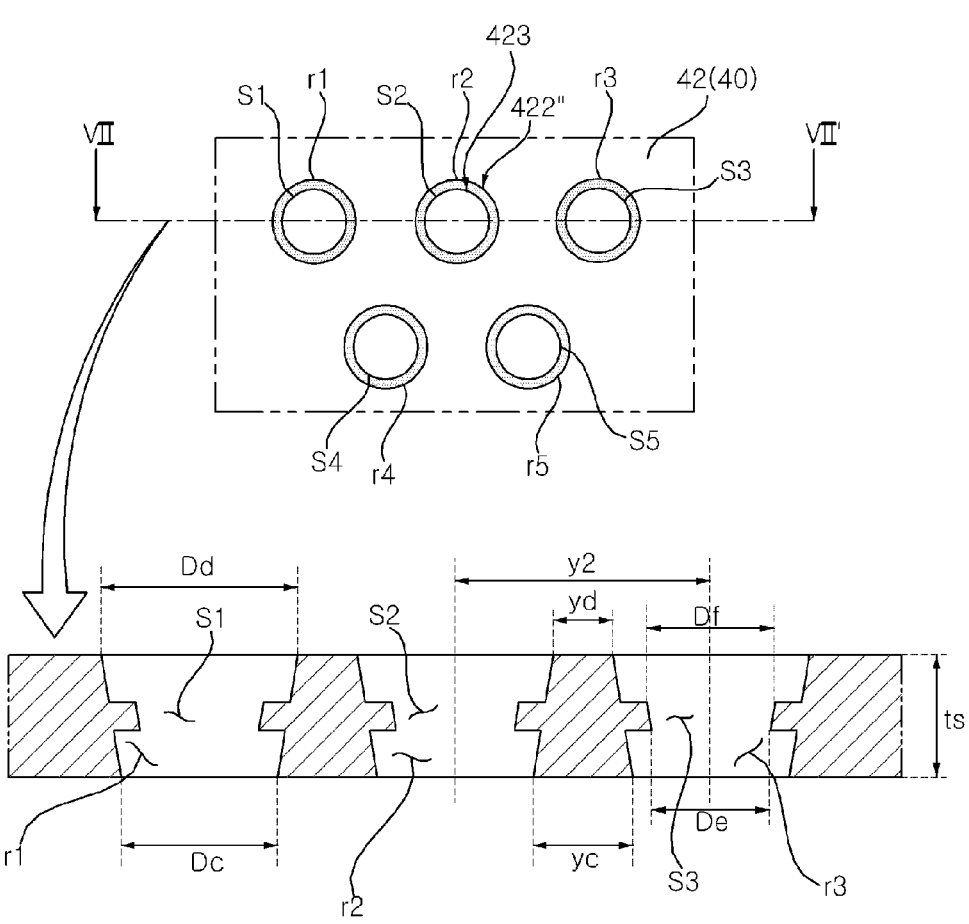

[FIG. 27]
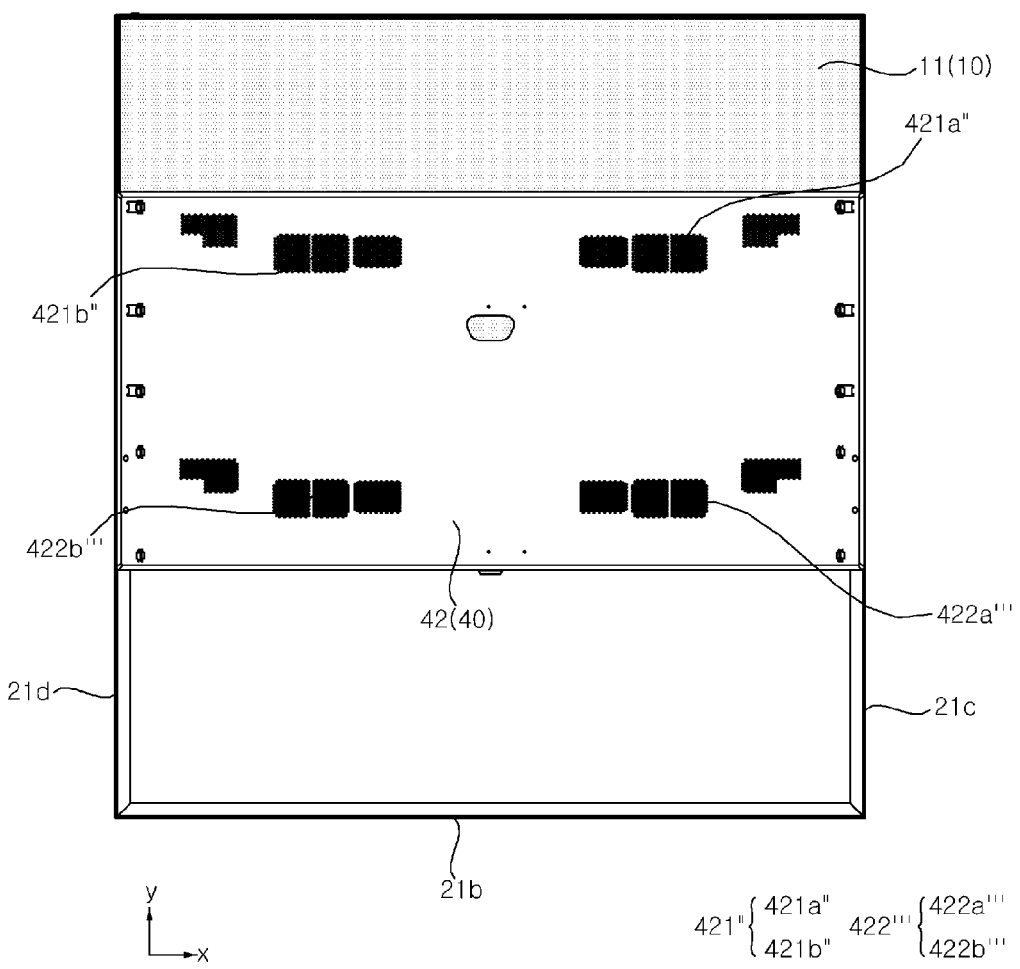

[FIG. 28]
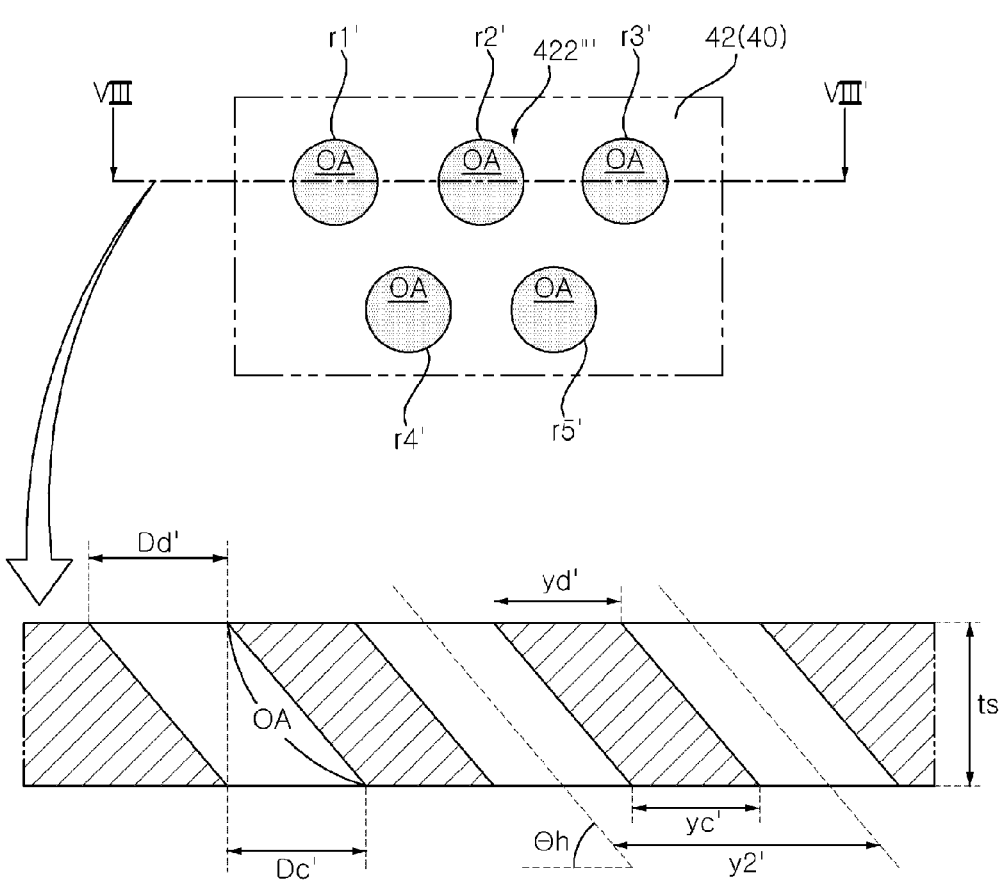

DISPLAY DEVICE

CROSS-REFERENCE TO RELATED APPLICATION(S)

This application is the National Stage filing under 35 U.S.C. 371 of International Application No. PCT/KR2021/006796, filed on Jun. 1, 2021, the contents of which is hereby incorporated by reference herein in its entirety.

TECHNICAL FIELD

The present disclosure relates to a display device.

BACKGROUND ART

As information society develops, the demand for display devices is also increasing in various forms. In response to this, various display devices such as Liquid Crystal Display Device (LCD), Plasma Display Panel (PDP), Electroluminescent Display (ELD), Vacuum Fluorescent Display (VFD), and Organic Light Emitting Diode (OLED) have been researched and used in recent years.

Among these, a LCD panel includes a TFT substrate and a color filter substrate facing each other with a liquid crystal layer interposed therebetween, and may display an image by using light provided from a backlight unit. In addition, an OLED panel may display an image by depositing an organic material layer capable of self-emitting light on a substrate on which a transparent electrode is formed.

Recently, a lot of research has been conducted on a structure covering the front surface of a display panel.

DISCLOSURE OF INVENTION

Technical Problem

An object of the present disclosure is to solve the above and other problems.

Another object may be to provide a cover assembly capable of opening and closing a front surface of a display panel.

Another object may be to provide a cover assembly which opens and closes a front surface of a display panel, and has a speaker hole through which sound from a speaker passes.

Another object may be to provide a structure capable of minimizing the occurrence of a shade difference between a part corresponding to the position of a speaker hole of cover and another part. Such a shade difference not only deteriorates the sense of unity of cover with respect to a display device, but also causes a user to be conscious of the shade difference, which may interfere with a user's viewing of display screen or hearing sound.

Another object may be to provide a structure capable of minimizing the occurrence of a shade difference in a cover depending on whether a speaker is located in a rear of a speaker hole.

Solution to Problem

According to an aspect of the present disclosure, there is provided a display device including: a display panel; a frame to which the display panel is coupled; a speaker located adjacent to the display panel; and a cover assembly located in front of the display panel and the speaker, wherein the cover assembly includes: a cover body which is movably coupled to the frame; and a cover which covers a front of the cover body, wherein the cover body includes: a first body hole formed through the cover body; and a second body hole which is formed through the cover body and which is spaced apart from the first body hole in a direction in which the cover body moves, wherein the speaker faces the first body hole or the second body hole.

Advantageous Effects of Invention

Effects of the display device according to the present disclosure are described as follows.

According to at least one of embodiments of the present disclosure, it is possible to provide a cover assembly capable of opening and closing a front surface of a display panel.

According to at least one of embodiments of the present disclosure, it is possible to provide a cover assembly which opens and closes a front surface of a display panel, and has a speaker hole through which sound from a speaker passes.

According to at least one of embodiments of the present disclosure, it is possible to provide a structure capable of minimizing the occurrence of a shade difference between a part corresponding to the position of a speaker hole of cover and another part.

According to at least one of embodiments of the present disclosure, it is possible to provide a structure capable of minimizing the occurrence of a shade difference in a cover depending on whether a speaker is located in a rear of a speaker hole.

Further scope of applicability of the present disclosure will become apparent from the following detailed description. However, it should be understood that the detailed description and specific embodiments such as preferred embodiments of the present disclosure are given by way of illustration only, since various changes and modifications within the spirit and scope of the present disclosure may be clearly understood by those skilled in the art.

BRIEF DESCRIPTION OF DRAWINGS

FIGS. 1 to 28 are diagrams illustrating examples of a display device according to embodiments of the present disclosure.

MODE FOR INVENTION

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, even if embodiments are described with reference to specific drawings, if necessary, reference numerals that do not appear in the specific drawings may be referred to, and reference numerals that do not appear in the specific drawings are used when the reference numerals appear in the other figures.

Referring to FIG. 1, a display device 1 may include a display panel 11. The display panel 11 may display an image.

The display device 1 may include a first long side LS1, a second long side LS2 opposite to the first long side LS1, a first short side SS1 adjacent to the first long side LS1 and the second long side LS2, and a second short side SS2 opposite to the first short side SS1. Meanwhile, for convenience of description, it is illustrated and described that the lengths of the first and second long sides LS1 and LS2 are longer than the lengths of the first and second short sides SS1 and SS2, but the lengths of the first and second long sides LS1 and LS2 may also substantially the same as the lengths of the first and second short sides SS1 and SS2.

A direction parallel to the long sides LS1 and LS2 of the display device 1 may be referred to as an up-down direction. A direction parallel to the short sides SS1 and SS2 of the display device 1 may be referred to as a left-right direction. A direction perpendicular to the long sides LS1 and LS2 and the short sides SS1 and SS2 of the display device 1 may be referred to as a front-rear direction.

A direction in which the display panel 11 displays an image may be referred to as front F, and a direction opposite to this may be referred to as rear R. The side of the first short side SS1 may be referred to as an upper side U. The side of the second short side SS2 may be referred to as a lower side D. The side of the first long side LS1 may be referred to as a left side Le. The side of the second long side LS2 may be referred to as a right side Ri.

The first long side LS1, the second long side LS2, the first short side SS1, and the second short side SS2 may be referred to as an edge of the display device 1. In addition, a point where the first long side LS1, the second long side LS2, the first short side SS1, and the second short side SS2 meet each other may be referred to as a corner.

For example, a point where the first short side SS1 and the first long side LS1 meet may be referred to as a first corner C1. A point where the first long side LS1 and the second short side SS2 meet may be referred to as a second corner C2. A point where the second short side SS2 and the second long side LS2 meet may be referred to as a third corner C3. A point where the second long side LS2 and the first short side SS1 meet may be referred to as a fourth corner C4.

Referring to FIGS. 2 and 3, a frame 20 may form a skeleton of the display device 1. The frame 20 may include an outer frame 21, a lower frame 22, an upper frame 23, and a guide frame 24. For example, the frame 20 may pass through the center of the display device and be symmetrical from side to side with respect to a reference line VV' (see FIG. 6) extending in an up-down direction.

The outer frame 21 forms a circumference of the frame 20 and may be a rectangular frame as a whole. A first outer frame 21a forms an upper side of the outer frame 21 and may extend long in the left-right direction. A second outer frame 21b forms a lower side of the outer frame 21 and may extend long in the left-right direction. A third outer frame 21c forms a left side of the outer frame 21 and may extend long in the up-down direction. A fourth outer frame 21d forms a right side of the outer frame 21 and may extend long in the up-down direction.

In addition, a first corner C1 (see FIG. 1) may be formed at a point where the first outer frame 21a and the third outer frame 21c meet. A second corner C2 (see FIG. 1) may be formed at a point where the third outer frame 21c and the second outer frame 21b meet. A third corner C3 (see FIG. 1) may be formed at a point where the second outer frame 21b and the fourth outer frame 21d meet. A fourth corner C4 (see FIG. 1) may be formed at a point where the fourth outer frame 21d and the first outer frame 21a meet.

A lower frame 22 may extend in the left-right direction between the third outer frame 21c and the fourth outer frame 21d, and be coupled to or fixed to the third outer frame 21c and the fourth outer frame 21d. The lower frame 22 may be disposed closer to the second outer frame 21b than to the first outer frame 21a.

An upper frame 23 may be located in the upper side of the lower frame 22. The upper frame 23 may be located in front of a guide frame 24 and a bar 25 described later. For example, the upper frame 23 may extend in the left-right direction between the third outer frame 21c and the fourth outer frame 21d, and may be coupled to or fixed to the third outer frame 21c and the fourth outer frame 21d. For another example, the upper frame 23 may extend in the left-right direction between a first guide frame 24a and a second guide frame 24b described later, and may be coupled to or fixed to the first guide frame 24a and the second guide frame 24b. Meanwhile, the upper frame 23 may be referred to as a center frame.

The guide frame 24 may extend long in the up-down direction between the first outer frame 21a and the lower frame 22. The first guide frame 24a may be coupled to or fixed to the third outer frame 21c in the right side of the third outer frame 21c, and the upper end of the first guide frame 24a may be coupled to or fixed to the first outer frame 21a. Furthermore, the lower end of the first guide frame 24a may be coupled to or fixed to the lower frame 22. The second guide frame 24b may be coupled to or fixed to the fourth outer frame 21d in the left side of the fourth outer frame 21d, and the upper end of the second guide frame 24b may be coupled to or fixed to the first outer frame 21a. Furthermore, the lower end of the second guide frame 24b may be coupled to or fixed to the lower frame 22.

Meanwhile, the bar 25 may extend long in the up-down direction between the first outer frame 21a and the lower frame 22, and may be coupled to or fixed to the first outer frame 21a and the lower frame 22. For example, the bar 25 may include a first bar 25a and a second bar 25b spaced apart from each other in the left-right direction. For example, a single bar 25 may be provided to be disposed in the center of the frame 20, or three or more bars 25 may be provided to be spaced apart from each other in the left-right direction. The bar 25 may be located in or adjacent to a reference line VV' that passes the center of the display device and extends in the up-down direction. Meanwhile, the bar 25 may be referred to as a vertical bar or a middle frame.

Referring to FIGS. 4 and 5, a display unit 10 of the display device 1 may include a display panel 11, a middle cabinet 12, a plate 13, a module cover 14, and a back cover 15.

For example, the display panel 11 may be an OLED panel, an LCD panel, or an LED panel. The display panel 11 may divide an image into a plurality of pixels and output the image by adjusting color, brightness, and saturation for each pixel. The display panel 11 may be divided into an active area in which an image is displayed and a de-active area in which an image is not displayed. The display panel 11 may generate light corresponding to red, green, or blue color according to a control signal. Meanwhile, the display panel 11 may be implemented by various panels such as LCD.

The middle cabinet 12 may be coupled to the display panel 11 in the rear of the display panel 11. The middle cabinet 12 may form a side surface of the display unit 10. The middle cabinet 12 may cover the side surface of the display panel 11. The middle cabinet 12 may be a square frame. For example, the middle cabinet 12 may include a metal material or a plastic material.

For example, the middle cabinet 12 may include a side part 12V and a rear part 12H. The side part 12V may form a side surface of the middle cabinet 12. A part of the side part 12V may cover the side surface of the display panel 11. The rear part 12H may be provided inside the side part 12V. The rear part 12H may cover a part of the rear of the display panel 11. Meanwhile, a gap pad 12a may be provided on the rear surface of the rear part 12H and may face the outer frame 21.

The plate 13 may be coupled to the display panel 11 at the rear of the display panel 11. In this case, an adhesive member T may be coupled to the display panel 11 and the plate 13 at between the display panel 11 and the plate 13. For example, the adhesive member T may be a double-sided tape.

The module cover 14 may be coupled to or fixed to the plate 13 at the rear of the plate 13. That is, the module cover 14 may cover the rear of the plate 13. The module cover 14 and the plate 13 may be disposed between the display panel 11 and the rear part 12H. A printed circuit board PCB or an electronic component may be installed in the rear surface of the module cover 14. For example, the module cover 14 may include a metal material. A rigid part 14a may be formed while being pressed from the front surface of the module cover 14 to the rear. Thus, the rigid part 14a may improve torsional rigidity and/or bending rigidity of the module cover 14. Meanwhile, the module cover 14 may be referred to as a main frame or an inner frame.

The back cover 15 may cover the rear of the module cover 14. The back cover 15 may form part of the rear surface of the display device 1. For example, the back cover 15 may include a metal material or a plastic material.

Meanwhile, the first outer frame 21a may include a vertical portion 21V and a horizontal portion 21H. The vertical portion 21V and the horizontal portion 21H may extend long in the left-right direction along the edge of the first outer frame 21a.

The vertical portion 21V may form an upper surface of the first outer frame 21a. The vertical portion 21V may have a width in a direction intersecting the display unit 10. In other words, the length of the vertical portion 21V may be defined in the left-right direction, the width of the vertical portion 21V may be defined in the front-rear direction, and the thickness of the vertical portion 21V may be defined in the up-down direction. A part of the vertical portion 21V may cover the side surface of the display unit 10.

The horizontal portion 21H may be provided in the lower side of the vertical portion 21V. The horizontal portion 21H may be disposed parallel to the display unit 10 at the rear of the display unit 10. In other words, the length of the horizontal portion 21H may be defined in the left-right direction, the width of the horizontal portion 21H may be defined in the up-down direction, and the thickness of the horizontal portion 2H may be defined in the front-rear direction. The horizontal portion 21H may cover a part of the rear of the display unit 10.

For example, the horizontal portion 21H may include a first horizontal portion 21Ha, a second horizontal portion 21Hb, and a third horizontal portion 21Hc that are spaced apart from each other in the front-rear direction. In this case, the width of the first horizontal portion 21Ha may be larger than that of the second horizontal portion 21Hb, and the width of the third horizontal portion 21Hc may be smaller than that of the second horizontal portion 21Hb. In addition, the first horizontal portion 21Ha may be bent at least twice.

A coupling part 210 may form a part of the first horizontal portion 21Ha, and may form a rearmost surface of the first horizontal portion 21Ha. The first guide frame 24a may contact the inside of the coupling part 210. A first fixing part 14b may protrude from the rigid part 14a toward the first guide frame 24a, that is, in a rearward direction.

The first fixing part 14b, the first guide frame 24a, and the coupling part 210 may be coupled to each other through a fastening member. For example, a first guide hole 241 may be formed to penetrate the first guide frame 24a, and a first coupling hole 211 may be formed to penetrate the coupling part 210. In this case, the first guide hole 241 and the first coupling hole 211 may be aligned with the first fixing part 14b, and the first fixing part 14b may be a pemnut fastened with a screw. Meanwhile, a coupling structure of the module cover 14 and the first guide frame 24a for the first outer frame 21a described above may be identically applied to a coupling structure of the module cover 14 and the second guide frame 24b (see FIG. 3) for the first outer frame 21a.

Accordingly, the display unit 10 may be coupled to the guide frame 24a, 24b and the first outer frame 21a through a fixing part provided in the rigid part 14a, so that torsional rigidity and/or bending rigidity of the display device may be improved.

Referring to FIG. 6, the module cover 14 may be disposed between the third outer frame 21c and the fourth outer frame 21d. The module cover 14 may be located in front of the bar 25. The upper end of the module cover 14 may be coupled to the first outer frame 21a, and the lower end of the module cover 14 may be coupled to the upper frame 23.

Electronic components may be mounted on the rear surface of the module cover 14. A first board E1, a second board E2, and a third board E3 may be spaced apart from each other but electrically connected, and may be mounted on the rear surface of the module cover 14.

The first board E1 may be a power supply board that supplies power to each component of the display device 1. The second board E2 may be a timing controller board that provides an image signal to the display panel 11 (see FIG. 5). In this case, a cable hole CH may be adjacent to the lower end of the module cover 14 and formed to penetrate the module cover 14, and a cable (not shown) may be connected to the display panel 11 of the second board E2 through the cable hole CH. The third board E3 may be a main board that controls each component of the display device 1.

A speaker SPKa, SPKb may be fixed on the lower frame 22 at between the upper frame 23 and the lower frame 22, and provide sound to the front of the display device 1. For example, a left speaker SPKa may be disposed between the third outer frame 21c and the first bar 25a, and a right speaker SPKb may be disposed between the fourth outer frame 21d and the second bar 25b.

Referring to FIG. 7, a mount 70 may be coupled to the coupling part 210 at the rear of the coupling part 210. In this case, the coupling part 210 may be coupled to the module cover 14 and the mount 70 at between the module cover 14 and the mount 70.

A seating part 213a may be formed while being lowered from the rear surface of the coupling part 210 in a forward direction, and may extend long in the left-right direction. A thickness of a lower end 213a1 of the seating part 213a may be smaller than a thickness of a portion of the coupling part 210 where the seating part 213a is not formed. In the longitudinal direction of the seating part 213a, a distal end 213a2 of the seating part 213a may be formed to be stepped with respect to a portion of the coupling part 210 where the seating part 213a is not formed. Meanwhile, the distal end 213a2 of the seating part 213a may be a left distal end 213a2 or a right distal end 213a2 of the seating part 213a.

The mount 70 may include a contact portion 70a and a flat plate portion 70b.

The contact portion 70a may contact the rear surface of the seating part 213a. For example, a front boss 70aa protrudes from the contact portion 70a toward the seating part 213a and may be inserted into an insertion groove provided in the rear surface of the seating part 213a. For another example, the front boss may protrude from the seating part 213a toward the contact portion 70a and be inserted into an insertion groove provided in the front surface of the contact portion 70a. Accordingly, the coupling of the contact portion 70a to the seating part 213a may be guided. Meanwhile, the contact portion 70a may be screwed to the seating part 213a near the front boss 70aa.

The flat plate portion 70b may be formed while being lowered in a forward direction with respect to the contact portion 70a, and may face the rear surface of the module cover 14. In this case, a stepped portion (no reference numeral) may be formed between the contact portion 70a and the flat plate portion 70b, and may contact or be hooked to the lower end 213a1 of the seating part 213a. Accordingly, the coupling of the mount 70 to the seating part 213a may be guided.

Referring to FIGS. 7 and 8, the bar 25 may be coupled to the seating part 213a and the mount 70 at the rear of the seating part 213a and the mount 70. The bar 25 may include a body 251 extending long in the up-down direction.

For example, the bar 25 may include a first bar 25a and a second bar 25b spaced apart from each other in the left-right direction. The first bar 25a may be adjacent to the left side of the mount 70 and coupled to the seating part 213a and the mount 70. The second bar 25b may be adjacent to the right side of the mount 70 and coupled to the seating part 213a and the mount 70.

A protrusion 251a may be adjacent to the upper end of the body 251 and protrude forward from the body 251. For example, the protrusion 251a may be formed by cutting a part of the body 251 and bending forward. The protrusion 251a may contact or be hooked to the lower end 213a1 of the seating part 213a. Thus, the coupling of the bar 25 to the seating part 213a may be guided. Meanwhile, a part of the body 251 may be located in the upper side of the protrusion 251a, contact the seating part 213a, and be screwed into a fastening hole 214a of the seating part 213a.

An insertion part 251b may be provided at the lower end of the body 251 and may be formed while being bent forward from the body 251. The insertion part 251b may be inserted into the lower frame 22 (see FIG. 6) and coupled to the lower frame 22 through a fastening member such as a screw. Accordingly, the bar 25 may be coupled to the first outer frame 21a and the lower frame 22 at between the first outer frame 21a (see FIG. 6) and the lower frame 22.

Meanwhile, a vertical rigid part 71 may be formed while being pressed from the front surface of the mount 70 in a rearward direction, and may extend in the longitudinal direction of the bar 25. For example, a first vertical rigid part 71a may be adjacent to the left side of the mount 70 and face the front surface of the first bar 25a. For example, a second vertical rigid part may be adjacent to the right side of the mount 70 and face the front surface of the second bar 25b. The body 251 may be screwed to the vertical rigid part 71.

Figure 18:
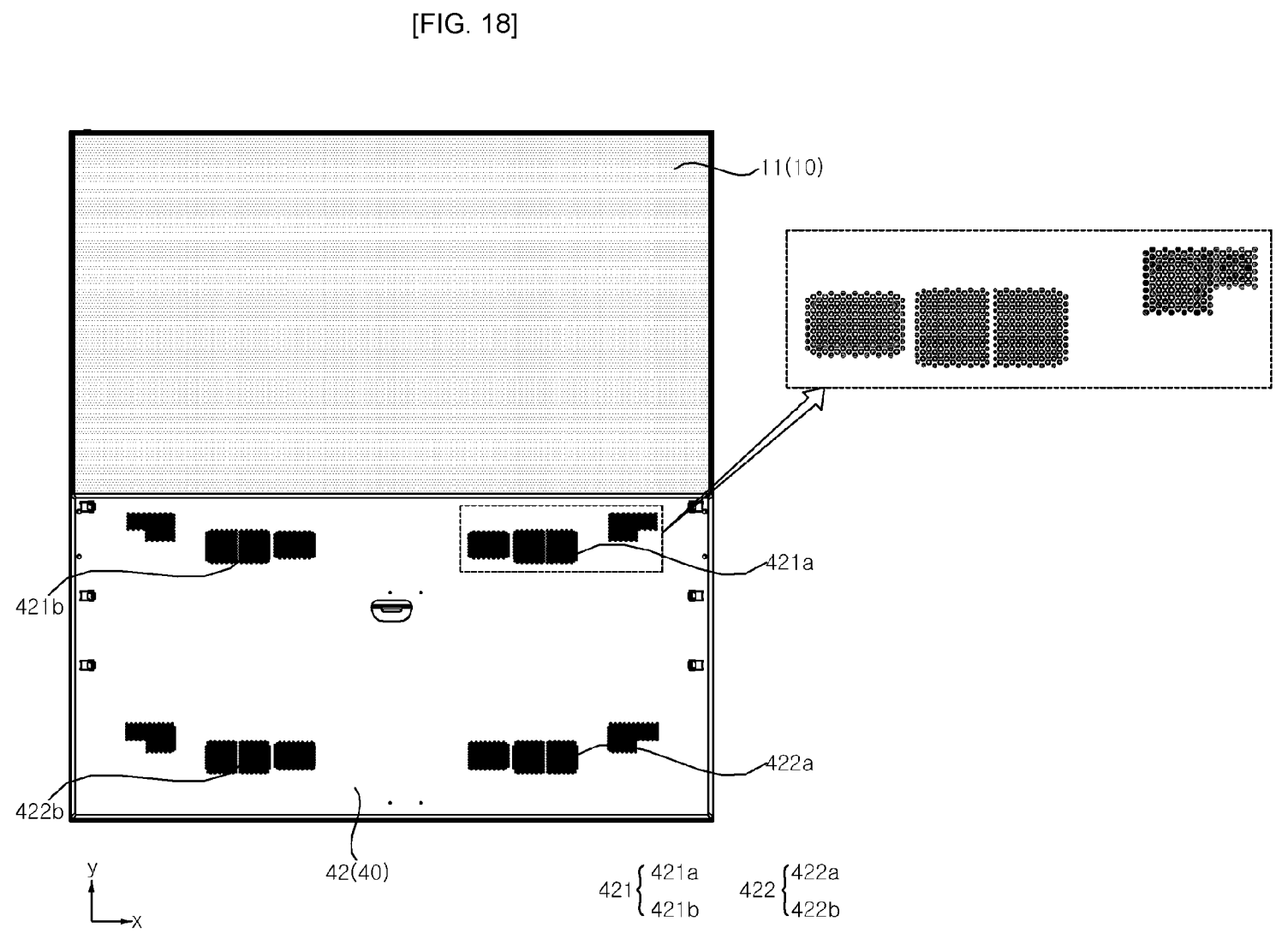

In addition, a bar fixing part 14d, 14e may protrude toward the bar 25 from the rear surface of the rigid part 14a. The bar fixing part 14d, 14e and the bar 25 may be coupled to each other through a fastening member. For example, a bar hole 251d, 251e (see FIG. 18) may be formed to penetrate the body 251. In this case, in the front-rear direction, the bar hole 251d, 251e may be aligned with the bar fixing part 14d, 14e, and the bar fixing part 14d, 14e may be a pemnut fastened with screw.

Accordingly, the bar 25 may be coupled to the first outer frame 21a, the mount 70, and the module cover 14 as one body. Meanwhile, a bracket 900 (see FIG. 2) may be disposed at the rear of the back cover 15 and coupled to the back cover 15 and the mount 70. In this case, the display device 1 may be installed on a fixed body such as a wall through the bracket 900.

Referring to FIGS. 6 and 9, a supporter 30 may extend long in the up-down direction. The supporter 30 may include a first part 31, a second part 32, and a third part 33.

The first part 31 may form the front surface of the supporter 30 and define the entire length of the supporter 30. The second part 32 may be bent in a rearward direction from the first part 31 and form a side surface of the supporter 30. The second part 32 may be disposed closer to the upper end than the lower end of the first part 31. For example, the upper end of the second part 32 may be connected to the upper end of the first part 31, and the length of the second part 32 may be about ½ of the length of the first part 31. The third part 33 may be bent to the right side or left side from the second part 32 and face the first part 31. At this time, the third part 33 may be spaced in a rearward direction from the first part 31. For example, the first part 31, the second part 32, and the third part 33 may be provided as one body. For another example, the first part 31, the second part 32, and the third part 33 may be separately provided, and may be coupled to each other through screw coupling or welding.

A supporter hole 312 may be formed to penetrate the first part 31 in the front-rear direction. For example, the supporter hole 312 may be provided with a pair of holes spaced apart from each other left and right. For example, the supporter hole 312 may include supporter holes 312a, 312b, and 312c spaced apart from each other in the longitudinal direction of the first part 31. The first supporter hole 312a may be adjacent to the upper end of the first part 31, the third supporter hole 312c may be adjacent to the lower end of the first part 31, and the second supporter hole 312b may be disposed between the first supporter hole 312a and the third supporter hole 312c.

The supporter 30 may include a first supporter 30a and a second supporter 30b spaced apart from each other in the left-right direction. The first supporter 30a may be adjacent to the third outer frame 21c, and the second supporter 30b may be adjacent to the fourth outer frame 21*d*. The second part 32 of the first supporter 30*a* may be provided at the left distal end of the first part 31, and the third part 33 of the first supporter 30*a* may be bent to the right side from the second part 32. The second part 32 of the second supporter 30*b* may be provided at the right distal end of the first part 31, and the third part 33 of the second supporter 30*b* may be bent to the left side from the second part 32.

For example, the first supporter 30*a* and the second supporter 30*b* may be symmetrical from side to side with respect to a reference line VV' that passes through the center of the display device and extends in the up-down direction.

Referring to FIGS. 9 and 10, the first supporter 30*a* may surround a part of the first guide frame 24*a*. A second gap gb may be formed between the first part 31 and the third part 33 of the first supporter 30*a*, and the first guide frame 24*a* may be disposed in the second gap gb.

Meanwhile, the description of the first supporter 30*a* for the first guide frame 24*a* described above may be identically applied to the description of the second supporter 30*b* for the second guide frame 24*b* (see FIG. 6).

Referring to FIGS. 11 and 12, the supporter 30 may be detachably coupled to a cover assembly 40 at the rear of the cover assembly 40. The cover assembly 40 may include a cover base 41, a cover body 42, and a cover 43.

The cover base 41 may be a rectangular plate as a whole. The first supporter 30*a* may be adjacent to the left side of the cover base 41, and the first part 311 of the first supporter 30*a* may contact the rear surface of the cover base 41. In this case, a fastening member F, such as a screw, may penetrate the cover base 41 from the front of the cover base 41 and be fastened to the supporter hole 312 (see FIG. 9) of the first supporter 30*a*. The second supporter 30*b* may be adjacent to the right side of the cover base 41, and the first part 311 of the second supporter 30*b* may contact the rear surface of the cover base 41. In this case, the fastening member F, such as a screw, may penetrate the cover base 41 from the front of the cover base 41 and be fastened to the supporter hole of the second supporter 30*b*. The cover base 41 may be disposed in front of the display unit 10.

In addition, a base hole 411, 412 may be formed to penetrate the cover base 41 in the front-rear direction, and may face a speaker SPKa, SPKb. A first base hole 411 may be located in the upper side of a second base hole 412, and the speaker SPKa, SPKb may face the first base hole 411 or the second base hole 412 in response to vertical movement of the cover assembly 40 described later. In the up-down direction, the first base hole 411 may be disposed closer to the display panel 11 than the second base hole 412. A first left base hole 411*a* or a second left base hole 412*a* may face a left speaker SPKa. A first right base hole 411*b* or a second right base hole 412*b* may face a right speaker SPKb.

The cover body 42 may be detachably coupled to the cover base 41 at the front of the cover base 41. A body hole 421, 422 may be formed to penetrate the cover body 42 in the front-rear direction and may face the base hole 411, 412.

The cover 43 may be detachably coupled to the cover body 42 at the front of the cover body 42. For example, the cover 43 may include a fabric material. Meanwhile, the cover 43 may be referred to as a jersey.

Meanwhile, the third outer frame 21*c* may cover the lateral surface and rear side of the first supporter 30*a*, and the cover assembly 40 (41, 42, 43) may cover the front of the first supporter 30*a*. A first gap ga may be formed between the third outer frame 21*c* and the first guide frame 24*a*. That is, the second part 32 of the first supporter 30*a* may be disposed in the first gap ga, and the first supporter 30*a* and the cover assembly 40 may be disposed to be movable in the up-down direction with respect to the third outer frame 21*c* and the first guide frame 24*a*.

Meanwhile, the description of the first supporter 30*a* for the aforementioned third outer frame 21*c* and the first guide frame 24*a* may be identically applied to the description of the second supporter 30*b* for the fourth outer frame 21*d* and the second guide frame 24*b* (see FIG. 6).

Referring to FIGS. 12 and 13, a first lift assembly 60*a* may be located at a rear of the first guide frame 24*a* and may be installed on the lower frame 22. The first lift assembly 60*a* may provide power to the first supporter 30*a*. Specifically, the first lift assembly 60*a* may include a motor 61, a motor mount 62, a torque limiter 63, a worm 64, a worm wheel 65, a lead screw 51, a connector 52, and a cap 53.

The motor 61 may provide rotational force. The motor 61 may be installed on the lower frame 22 through the motor mount 62. The torque limiter 63 may be connected to the rotation shaft of the motor 61 to limit the torque of the motor.

The worm 64 may be fixed to the rotation shaft of the motor 61 and may be rotated together with the rotation shaft. For example, the worm 64 may extend in the left-right direction and rotate about an axis parallel to the left-right direction. The worm wheel 65 may be engaged with a screw thread formed on an outer circumferential surface of the worm 64. The worm wheel 65 may extend in the up-down direction, and rotate about an axis parallel to the up-down direction.

The lead screw 51 may extend long in the up-down direction, and the lower end of the lead screw 51 may be fixed to the worm wheel 65. A male screw thread may be formed on an outer circumferential surface of the lead screw 51.

The connector 52 may be formed in a block shape as a whole. A connector hole (no reference numeral) may be formed to penetrate the connector 52 in the up-down direction, and the lead screw 51 may penetrate the connector hole. A female screw thread may be formed at a portion forming a boundary of the connector hole of the connector 52 and be engaged with the male screw thread. One side of the connector 52 may be coupled to or fixed to the third part 33 of the first supporter 30*a*.

The cap 53 may be provided in the upper side of the connector 52. The cap 53 may be formed in a ring shape as a whole. The lead screw 51 may penetrate the connector hole and the cap 53.

A rail 242 may protrude from the rear surface of the first guide frame 24*a* toward the third part 33 of the first supporter 30*a*, and may be spaced apart from the third part 33. The rail 242 may extend long in the up-down direction. The rail 242 may be formed in an H beam or I beam shape as a whole. The rail 242 may guide the vertical movement of a slider 34 described later.

The slider 34 may be provided on the front surface of the third part 33 of the first supporter 30*a*, and the slider 34 may surround a part of the rail 242. That is, the slider 34 may be movably coupled to the rail 242 in the up-down direction. For example, the slider 34 may include at least two sliders spaced apart from each other in the up-down direction.

Accordingly, when the motor 61 is driven, the first supporter 30*a* may move up and down along the lead screw 51.

Meanwhile, a second lift assembly 60*b* may be located in a rear of the second guide frame 24*b* and may be installed on the lower frame 22 (see FIG. 6). The second lift assembly 60*b* may provide power to the second supporter 30*b*. The second lift assembly 60b and the first lift assembly 60a may be symmetrical from side to side with respect to the reference line VV' (see FIG. 6).

Accordingly, in response to the operation of the first lift assembly 60a and the second assembly 60b, the cover assembly 40 fixed to the first supporter 30a and the second supporter 30b may be ascended or descended.

Referring to FIG. 14, a stopper 54 may be fixed to the first guide frame 24a at the rear of the first guide frame 24a. The upper end of the lead screw 51 may be rotatably coupled to the lower side of the stopper 54. The cap 53 may face the lower side of the stopper 54 and may be detachably coupled to the lower side of the stopper 54. Meanwhile, the stopper 54 may be referred to as a holder.

Accordingly, when the cap 53 is coupled to the stopper 54, the stopper 54 may limit the ascending My of the connector 52 corresponding to the rotation of the lead screw 51.

Referring to FIG. 15, the cover 43 may move in the up-down direction at the front of the display panel 11.

Referring to the left drawing of FIG. 15, in a first state of the display device, the cover 43 may not cover the display panel 11. In this case, the height h1 of the forwardly exposed area of the display panel 11 may be the entire height of the display panel 11. For example, the display device may provide maximum speaker output in the first state.

Referring to the right drawing of FIG. 15, in a second state of the display device, the cover 43 may cover at least a portion of the display panel 11. In this case, the height h2 of the forwardly exposed area of the display panel 11 may be smaller than the entire height of the display panel 11. For example, the display device may provide a speaker output lower than the maximum in the second state. In other words, the speaker output or sound quality of the display device in the second state may be lower than the speaker output or sound quality of the display device in the first state.

That is, the cover 43 may gradually cover the display panel 11 while ascending, or may gradually expose the display panel 11 while descending.

Referring to FIGS. 16 and 17, a body hole 421', 422' may be formed to penetrate the cover body 42 in the front-rear direction. A first body hole 421' may be located in the upper side of a second body hole 422'. For example, the first body hole 421' may include a first left body hole 421a' and a first right body hole 421b', and the second body hole 422' may include a second left body hole 422a' and a second right body hole 422b'.

A first left body hole 421a' may be located in the left side of the first right body hole 421b', and may face the first left base hole 411a (see FIG. 11). Here, the size and shape of the first left base hole 411a may correspond to a sound outlet of the left speaker SPKa. That is, the first left base hole 411a may face the left speaker SPKa, and the size of the first left base hole 411a may be equal to or larger than the size of the sound outlet of the left speaker SPKa. For example, the size and shape of the first left body hole 421a' may be substantially the same as the size and shape of the first left base hole 411a.

The first right body hole 421b' may be located in the right side of the first left body hole 421a' and may face the first right base hole 411b (see FIG. 11). Here, the size and shape of the first right base hole 411b may correspond to the sound outlet of the right speaker SPKb. That is, the first right base hole 411b may face the right speaker SPKb, and the size of the first right base hole 411b may be equal to or larger than the size of the sound outlet of the right speaker SPKb. For example, the size and shape of the first right body hole 421b' may be substantially the same as the size and shape of the first right base hole 411b.

The second left body hole 422a' may be located in the lower side of the first left body hole 421a' and may face the second left base hole 412a (see FIG. 11). Here, the second left base hole 412a may be located in the lower side of the first left base hole 411a, and the size and shape of the second left base hole 412a may be substantially the same as the size and shape of the first left base hole 411a. The size and shape of the second left body hole 422a' may be substantially the same as the size and shape of the first left body hole 421a'.

The second right body hole 422b' may be located in the lower side of the first right body hole 421b' and may face the second right base hole 412b (see FIG. 11). Here, the second right base hole 412b may be located in the lower side of the first right base hole 411b, and the size and shape of the second right base hole 412b may be substantially the same as the size and shape of the first right base hole 411b. The size and shape of the second right body hole 422b' may be substantially the same as the size and shape of the first right body hole 421b'.

Further, the distance between the first left body hole 421a' and the first right body hole 421b' may be substantially the same as the distance between the second left body hole 422a' and the second right body hole 422b'. In addition, the distance between the first left body hole 421a' and the second left body hole 422a' may be substantially the same as the distance between the first right body hole 421b' and the second right body hole 422b'.

Accordingly, in the first state of the display device (see FIG. 16), the first left body hole 421a' and the first right body hole 421b' may face the left speaker SPKa and the right speaker SPKb, respectively. In addition, in the second state of the display device (see FIG. 17), the second left body hole 422a' and the second right body hole 422b' may face the left speaker SPKa and the right speaker SPKb, respectively.

However, a portion corresponding to the first body hole 421' and the second body hole 422' of the cover 43 (see FIG. 15) may have a shade difference from other portion. Such a shade difference not only deteriorates the sense of unity of the cover 43 with respect to the display device, but also causes a user to become conscious of the shade difference, which may interfere with user's viewing of the display screen or hearing sound.

In particular, in the first state of the display device, the speakers SPKa and SPKb are disposed in the rear of the first body hole 421', whereas a speaker-like component may not be disposed in the rear of the second body hole 422'. Due to this, in the first state of the display device, a shade difference may appear clearly between a portion corresponding to the second body hole 422' of the cover 43 (see FIG. 15) and other portion.

Figure 19:
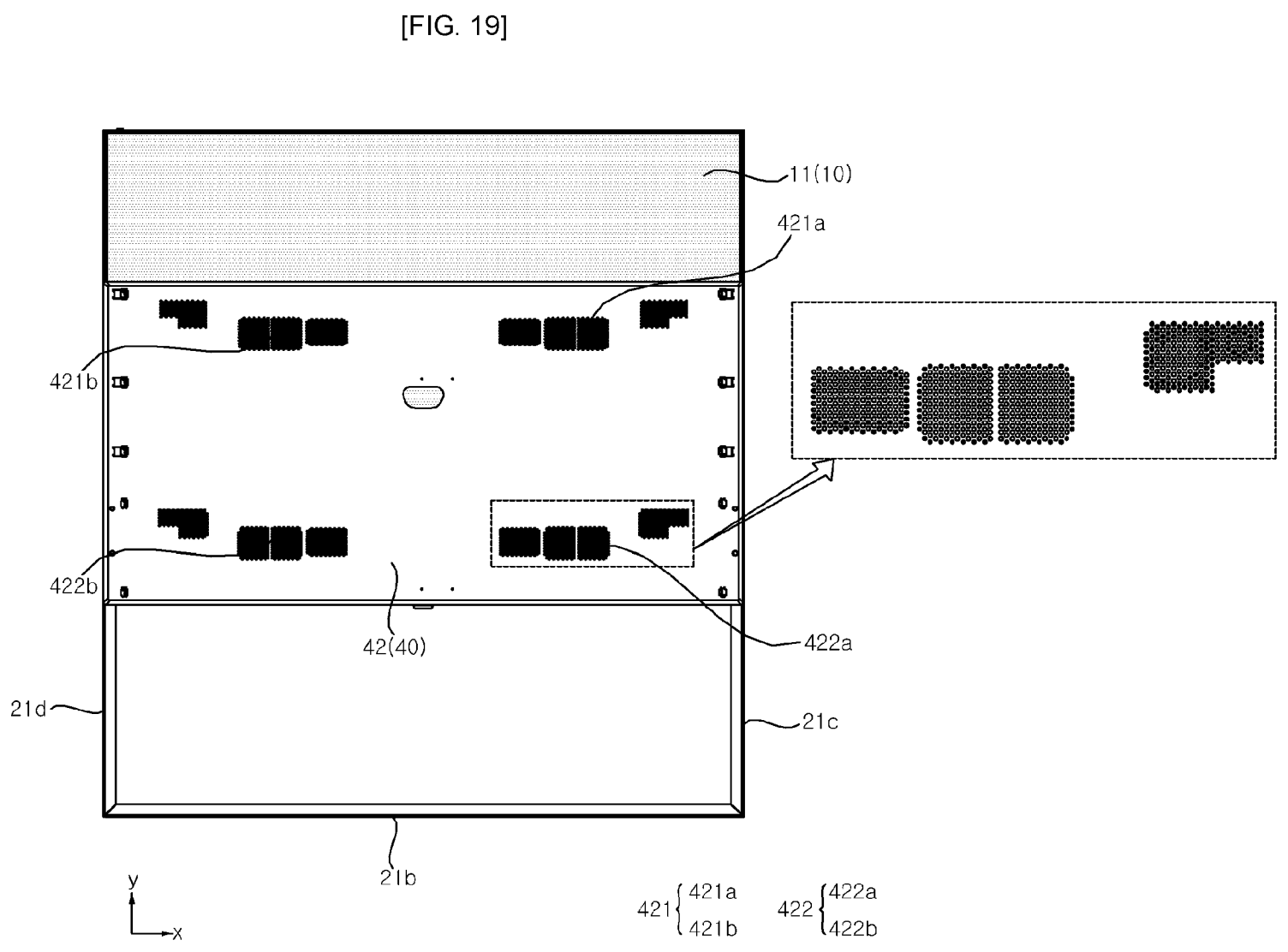

Referring to FIGS. 18 and 19, the body hole 421, 422 may be formed to penetrate the cover body 42 in the front-rear direction. Meanwhile, the body hole 421, 422 may be referred to as a speaker hole. A first body hole 421 may be located in the upper side of a second body hole 422. For example, the first body hole 421 may be adjacent to the upper side of the cover body 42, and the second body hole 422 may be adjacent to the lower side of the cover body 42. For example, the first body hole 421 may include a first left body hole 421a and a first right body hole 421b, and the second body hole 422 may include a second left body hole 422a and a first right body hole 422b.

The first left body hole 421a may be located in the left side of the first right body hole 421b and may face the first left base hole 411*a* (see FIG. 11). Here, the size and shape of the first left base hole 411*a* may correspond to the sound outlet of the left speaker SPKa. That is, the first left base hole 411*a* may face the left speaker SPKa, and the size of the first left base hole 411*a* may be equal to or larger than the size of the sound outlet of the left speaker SPKa. For example, the first left body hole 421*a* may be formed of a plurality of holes that are smaller and more numerous than the first left base hole 411*a*.

The first right body hole 421*b* may be located in the right side of the first left body hole 421*a* and may face the first right base hole 411*b* (see FIG. 11). Here, the size and shape of the first right base hole 411*b* may correspond to the sound outlet of the right speaker SPKb. That is, the first right base hole 411*b* may face the right speaker SPKb, and the size of the first right base hole 411*b* may be equal to or larger than the size of the sound outlet of the right speaker SPKb. For example, the first right body hole 421*b* may be formed of a plurality of holes that are smaller and more numerous than the first right base hole 411*b*.

The second left body hole 422*a* may be located in the lower side of the first left body hole 421*a* and may face the second left base hole 412*a* (see FIG. 11). Here, the second left base hole 412*a* may be located in the lower side of the first left base hole 411*a*, and the size and shape of the second left base hole 412*a* may be substantially the same as the size and shape of the first left base hole 411*a*. The second left body hole 422*a* may be formed of a plurality of holes that are smaller and more numerous than the second left base hole 412*a*. For example, the size and shape of the second left body hole 422*a* may be substantially the same as the size and shape of the first left body hole 421*a*.

The second right body hole 422*b* may be located in the lower side of the first right body hole 421*b* and may face the second right base hole 412*b* (see FIG. 11). Here, the second right base hole 412*b* may be located in the lower side of the first right base hole 411*b*, and the size and shape of the second right base hole 412*b* may be substantially the same as the size and shape of the first right base hole 411*b*. The second right body hole 422*b* may be formed of a plurality of holes that are smaller and more numerous than the second right base hole 412*b*. For example, the size and shape of the second right body hole 422*b* may be substantially the same as the size and shape of the first right body hole 421*b*.

In addition, the distance between the first left body hole 421*a* and the first right body hole 421*b* may be substantially the same as the distance between the second left body hole 422*a* and the second right body hole 422*b*. In addition, the distance between the first left body hole 421*a* and the second left body hole 422*a* may be substantially the same as the distance between the first right body hole 421*b* and the second right body hole 422*b*.

Accordingly, in the first state of the display device (see FIG. 18), each of the first left body hole 421*a* and the first right body hole 421*b* may face each of the left speaker SPKa and the right speaker SPKb. In addition, in the second state of the display device (see FIG. 19), each of the second left body hole 422*a* and the second right body hole 422*b* may face each of the left speaker SPKa and the right speaker SPKb.

At this time, the first body hole 421 and the second body hole 422 are provided as a plurality of small-sized holes, thereby reducing the shade difference between a portion corresponding to the first body hole 421 and the second body hole 422 of the cover 43 (see FIG. 15) and other portion.

In addition, in the first state of the display device, the speakers SPKa and SPKb are disposed behind the first body hole 421, whereas a speaker-like component may not be disposed in the rear of the second body hole 422. However, as the second body hole 422 is formed of small-sized holes, in the first state of the display device, a shade difference between a portion corresponding to the second body hole 422 of the cover 43 (see FIG. 15) and other portion may be reduced.

Referring to FIGS. 20 and 21, the shape and size of the first body hole 421 may be substantially the same as the shape and size of the second body hole 422.

For example, the first body hole 421 and the second body hole 422 may be formed as circular holes. In this case, the circular holes may be sequentially arranged in the left-right and up-down directions, and may be alternately disposed in the up-down direction. A gap between the circular holes may be constant. That is, a first hole P1, a second hole P2, and a third hole P3 may be adjacent to each other, the distance d11 between the center of the first hole P1 and the center of the second hole P2 may be equal to the distance d12 between the center of the first hole P1 and the center of the third hole P3, and the distance d13 between the center of the second hole P2 and the center of the third hole P3. In other words, a line connecting the centers of each of the first hole P1, the second hole P2, and the third hole P3 may form an equilateral triangle.

For another example, the first body hole 421 and the second body hole 422 may be formed as long slits. In this case, the slits may be sequentially arranged in the left-right and up-down directions, and may be alternately disposed in the up-down direction. A gap between the slits in the left-right direction may be smaller than a gap between the slits in the up-down direction. That is, the first hole P1', the second hole P2', and the third hole P3' may be adjacent to each other, the distance d12' between the center of the first hole P1' and the center of the third hole P3' may be identical with the distance d13' between the center of the second hole P2' and the center of the third hole P3', but may be larger than the distance d11' between the center of the first hole P1' and the center of the second hole P2'. In other words, a line connecting the centers of each of the first hole P1', the second hole P2', and the third hole P3' may form an isosceles triangle.

Referring to FIGS. 22 to 25, a body hole 421", 422" may be formed to penetrate the cover body 42 in the front-rear direction. The first body hole 421" may be located in the upper side of the second body hole 422". For example, the first body hole 421" may be adjacent to the upper side of the cover body 42, and the second body hole 422" may be adjacent to the lower side of the cover body 42. For example, the first body hole 421" may include a first left body hole 421*a"* and a first right body hole 421*b"*, and the second body hole 422" may include a second left body hole 422*a"* and a second right body hole 422*b"*.

The first left body hole 421*a"* may be located on the left side of the first right body hole 421*b"* and may face the first left base hole 411*a* (see FIG. 11). Here, the size and shape of the first left base hole 411*a* may correspond to the sound outlet of the left speaker SPKa. That is, the first left base hole 411*a* may face the left speaker SPKa, and the size of the first left base hole 411*a* may be equal to or larger than the size of the sound outlet of the left speaker SPKa. For example, the first left body hole 421*a"* may be formed of a plurality of holes that are smaller and more numerous than the first left base hole 411*a*.

The first right body hole 421*b"* may be located in the right side of the first left body hole 421*a"* and may face the first right base hole 411*b* (see FIG. 11). Here, the size and shape of the first right base hole 411*b* may correspond to the sound outlet of the right speaker SPKb. That is, the first right base hole 411*b* may face the right speaker SPKb, and the size of the first right base hole 411*b* may be equal to or larger than the size of the sound outlet of the right speaker SPKb. For example, the first right body hole 421*b*" may be formed of a plurality of holes that are smaller and more numerous than the first right base hole 411*b*.

In addition, the shape and size of the first left body hole 421*a*" may be substantially the same as the shape and size of the first right body hole 421*b*". The first body hole 421" may be formed of a plurality of first holes. In this case, the plurality of first holes may be sequentially arranged in the left-right and up-down directions, and may be alternately disposed in the up-down direction.

Specifically, each of the plurality of first holes g1, g2, g3, g4, and g5 (see FIG. 23) may have a front end formed on the front surface of the cover body 42 and a rear end formed on the rear surface of the cover body 42. The front end may face the cover 43 (see FIG. 11), and the rear end may face the cover base 41 (see FIG. 11). The diameter Da of the front end may be smaller than the diameter Db of the rear end.

For example, the diameter Da of the front end may be 4.5 mm, and the diameter Db of the rear end may be 5.3 mm. For example, the distance y1 between the plurality of first holes g1, g2, g3, g4, and g5 may be 6.5 mm, the distance ya between the boundaries of the first holes on the front surface of the cover body 42 may be 2 mm, and the distance yb between the boundaries of the first holes on the rear surface of the cover body 42 may be 1.2 mm.

Accordingly, the first holes g1, g2, g3, g4, and g5 may be easily formed in the cover body 42 having a certain thickness ts. In addition, as the diameter Db of the rear end is larger than the diameter Da of the front end, the sound of the speaker SPKa, SPKb may be smoothly provided to the front of the display device through the rear end and the front end sequentially.

The second left body hole 422*a*" may be located in the lower side of the first left body hole 421*a*" and may face the second left base hole 412*a* (see FIG. 11). Here, the second left base hole 412*a* may be located in the lower side of the first left base hole 411*a*, and the size and shape of the second left base hole 412*a* may be substantially the same as the size and shape of the first left base hole 411*a*. The second left body hole 422*a*" may be formed of a plurality of holes that are smaller and more numerous than the second left base hole 412*a*.

The second right body hole 422*b*" may be located in the lower side of the first right body hole 421*b*" and may face the second right base hole 412*b* (see FIG. 11). Here, the second right base hole 412*b* may be located in the lower side of the first right base hole 411*b*, and the size and shape of the second right base hole 412*b* may be substantially the same as the size and shape of the first right base hole 411*b*. The second right body hole 422*b*" may be formed of a plurality of holes that are smaller and more numerous than the second right base hole 412*b*.

In addition, the shape and size of the second left body hole 422*a*" may be substantially the same as the shape and size of the second right body hole 422*b*". The second body hole 422" may be formed of a plurality of second holes. In this case, the plurality of second holes may be sequentially arranged in left-right and up-down directions, and may be alternately disposed in up-down direction.

Specifically, each of the plurality of second holes r1, r2, r3, r4, and r5 (see FIG. 25) may have a front end formed on the front surface of the cover body 42 and a rear end formed on the rear surface of the cover body 42. The front end may face the cover 43 (see FIG. 11), and the rear end may face the cover base 41 (see FIG. 11). The diameter Dc of the front end may be smaller than the diameter Dd of the rear end. Here, the diameter Dc may be smaller than the diameter Da (see FIG. 23), and the diameter Dd may be smaller than the diameter Db (see FIG. 23). In other words, the second body hole 422" may be smaller than the first body hole 421".

For example, the diameter Dc of the front end may be 3.5 mm, and the diameter Dd of the rear end may be 4.3 mm. For example, the distance y2 between the plurality of second holes r1, r2, r3, r4, and r5 may be 5.5 mm, the distance ya between the boundaries of the second holes on the front surface of the cover body 42 may be 2 mm, and the distance yb between the boundaries of the second holes on the rear surface of the cover body 42 may be 1.2 mm.

Accordingly, the second holes r1, r2, r3, r4, and r5 may be easily formed in the cover body 42 having a certain thickness ts. In addition, as the diameter Dd of the rear end is larger than the diameter Dc of the front end, the sound of the speaker SPKa, SPKb may be smoothly provided to the front of the display device through the rear end and the front end sequentially.

In addition, the distance between the first left body hole 421*a*" and the first right body hole 421*b*" may be substantially the same as the distance between the second left body hole 422*a*" and the second right body hole 422*b*". In addition, the distance between the first left body hole 421*a*" and the second left body hole 422*a*" may be substantially the same as the distance between the first right body hole 421*b*" and the second right body hole 422*b*".

Accordingly, in the first state of the display device (see FIG. 22), the first left body hole 421*a*" and the first right body hole 421*b*" may face the left speaker SPKa and the right speaker SPKb, respectively. In addition, in the second state of the display device (see FIG. 24), the second left body hole 422*a*" and the second right body hole 422*b*" may face the left speaker SPKa and the right speaker SPKb, respectively.

At this time, the first body hole 421" and the second body hole 422" are provided as a plurality of small-sized holes, thereby reducing a shade difference between a portion corresponding to the first body hole 421" and the second body hole 422" of the cover 43 (see FIG. 15) and other portion.

In addition, in the first state of the display device, the speakers SPKa and SPKb may be disposed at the rear of the first body hole 421", whereas component such as the speaker may not be disposed at the rear of the second body hole 422". However, as the second body hole 422" is formed with holes smaller than the first body hole 421", in the first state of the display device, a shade difference between a portion corresponding to the second body hole 422" of the cover 43 (see FIG. 15) and other portion may be further reduced.

Meanwhile, it is also possible that the cover body 42 includes the aforementioned first body hole 421 (see FIG. 18) and the second body hole 422".

Referring to FIG. 26, a protrusion 423 may be formed in a portion forming a boundary of the second body hole 422" of the cover body 42. The protrusion 423 may be formed in a ring shape as a whole. The protrusion 423 may form boundary of the inner hole S1, S2, S3, S4, and S5.

Specifically, the inner hole 51, S2, S3, S4, and S5 may have a front end adjacent to the front surface of the cover body 42 and a rear end adjacent to the rear surface of the cover body 42. The front end may face the cover 43 (see FIG. 11), and the rear end may face the cover base 41 (see FIG. 11). The diameter De of the front end may be smaller than the diameter Df of the rear end. Here, the diameter De may be smaller than the diameter Dc, and the diameter Df may be smaller than the diameter Dd.

At this time, in the first state of the display device (see FIG. 22), the speaker SPKa, SPKb may be disposed at the rear of the first body hole 421", whereas a component such as a speaker may not be disposed at the rear of the second body hole 422". However, as the protrusion 423 is provided inside the second body hole 422", in the first state of the display device, a shade difference between a portion corresponding to the second body hole 422" of the cover 43 (see FIG. 15) and other portion may be minimized.

Meanwhile, it is also possible that the cover body 42 includes the aforementioned first body hole 421 (see FIG. 18) and the second body hole 422" in which the protrusion 423 is formed. At this time, in the first state of the display device, it is preferable that the protrusion 423 is not provided in the first body hole (421; 421") in order to provide an output of the speaker SPKa, SPKb and a high-quality sound.

Referring to FIGS. 27 and 28, the second body hole 422' may be formed to penetrate the cover body 42 in a direction intersecting the thickness direction of the cover body 42, that is, the front-rear direction. The second body hole 422' may be adjacent to the lower side of the cover body 42. For example, the second body hole 422' may include a second left body hole 422a''' and a second right body hole 422r.

The shape and size of the second left body hole 422a' may be substantially the same as the shape and size of the second right body hole 422r. The second body hole 422" may be formed of a plurality of second holes. In this case, the plurality of holes may be sequentially arranged in the left-right and up-down directions, and may be alternately disposed in the up-down direction.

Specifically, each of the plurality of second holes r1', r2', r3', r4', and r5' (see FIG. 28) may have a front end formed on the front surface of the cover body 42 and a rear end formed on the rear surface of the cover body 42. The front end may face the cover 43 (see FIG. 11), and the rear end may face the cover base 41 (see FIG. 11). The diameter Dc' of the front end may be substantially the same as or smaller than the diameter Dd' of the rear end.

In addition, a virtual line connecting the front end and the rear end may be inclined at a certain angle (theta h) with respect to a virtual vertical plane parallel to the front surface of the cover body 42. That is, a part of a portion forming the boundary of the second hole r1', r2', r3', r4', r5' (see FIG. 28) of the cover body 42 may face forward (see OA).

Accordingly, as a part of the portion forming the boundary of the second hole r1', r2', r3', r4', r5' (see FIG. 28) of the cover body 42 at the front of the cover body 42 is illuminated (see OA), in the first state of the display device, a shade difference between a portion corresponding to the second body hole 422' of the cover 43 and other portion may be minimized.

Meanwhile, it is also possible that the cover body 42 includes the aforementioned first body hole 421 (see FIG. 18) and the second body hole 422'. In addition, a protrusion 423 (see FIG. 26) may be formed inside a portion forming a boundary of the second body hole 422' of the cover body 42. At this time, in the first state of the display device, in order to provide an output of speaker SPKa, SPKb and a high-quality sound, the first body hole (421; 421") is preferably formed to penetrate the cover body 42 in the front-rear direction.

According to an aspect of the present disclosure, there is provided a display device including: a display panel; a frame to which the display panel is coupled; a speaker located adjacent to the display panel; and a cover assembly located in front of the display panel and the speaker, wherein the cover assembly includes: a cover body which is movably coupled to the frame; and a cover which covers a front of the cover body, wherein the cover body includes: a first body hole formed through the cover body; and a second body hole which is formed through the cover body and which is spaced apart from the first body hole in a direction in which the cover body moves, wherein the speaker faces the first body hole or the second body hole.

According to another aspect of the present disclosure, the speaker may be adjacent to a lower side of the display panel and may provide sound in a forward direction, the first body hole may be located above the second body hole, and the first body hole or the second body hole may be aligned with the speaker in a front-rear direction.

According to another aspect of the present disclosure, the cover may be located in front of the cover body, may be detachably coupled to the cover body, and may include a fabric material.

According to another aspect of the present disclosure, the direction in which the cover body moves may be a direction in which the cover body approaches or moves away from the display panel, and the first body hole may be disposed closer to the display panel than to the second body hole in the moving direction.

According to another aspect of the present disclosure, the cover assembly may further include a cover base which is movably coupled to the frame, and to which the cover body is fixed, wherein the cover base may include: a first base hole formed through the cover base in a front-rear direction, and facing the first body hole; and a second base hole formed through the cover base in a front-rear direction, and facing the second body hole, wherein a shape of each of the first base hole and the second base hole may correspond to a sound outlet of the speaker.

According to another aspect of the present disclosure, the first body hole may include a plurality of first holes formed through the cover body in a front-rear direction, and the second body hole includes a plurality of second holes formed through the cover body in a front-rear direction.

According to another aspect of the present disclosure, each of the plurality of first holes may be smaller than a sound outlet of the speaker, and each of the plurality of second holes may be smaller than the sound outlet of the speaker.

According to another aspect of the present disclosure, a size of the plurality of second holes may be substantially equal to a size of the plurality of first holes.

According to another aspect of the present disclosure, a size of the plurality of second holes may be smaller than a size of the plurality of first holes.

According to another aspect of the present disclosure, each of the plurality of first holes may include: a first front end having a first diameter; and a first rear end having a second diameter greater than the first diameter, wherein each of the plurality of second holes may include: a second front end having a third diameter smaller than the first diameter; and a second rear end having a fourth diameter larger than the third diameter but smaller than the second diameter.

According to another aspect of the present disclosure, the cover body may further include a protrusion which is formed inside a portion forming a boundary of the second hole of the cover body, and which forms a boundary of an inner hole having a smaller diameter than a diameter of the second hole.

According to another aspect of the present disclosure, the first body hole may include a plurality of first holes formed through the cover body in a front-rear direction, and the second body hole includes a plurality of second holes formed through the cover body in a direction intersecting a front-rear direction.

According to another aspect of the present disclosure, a part of a portion forming a boundary of the second hole of the cover body may face the cover.

According to another aspect of the present disclosure, the speaker may include a pair of speakers spaced apart from each other in a left-right direction, the first body hole may include a pair of first body holes spaced apart from each other in a left-right direction, and the second body hole may include a pair of second body holes spaced apart from each other in a left-right direction.

According to another aspect of the present disclosure, the display device may further include a lift assembly that provides power to the cover body, and the cover may open or close at least a part of a front surface of the display panel.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
a display panel;
a frame to which the display panel is coupled;
a speaker located adjacent to the display panel; and
a cover assembly located in front of the display panel and the speaker,
wherein the cover assembly comprises:
a cover body coupled to the frame and movable in a first direction; and
a cover which covers a front of the cover body,
wherein the cover body comprises:
a first body hole formed through the cover body; and
a second body hole which is formed through the cover body and which is spaced apart from the first body hole in the first direction in which the cover body moves,
wherein the speaker selectively faces either the first body hole or the second body hole, depending on a position of the cover body.

2. The display device of claim 1, wherein the speaker is adjacent to a lower side of the display panel and provides sound in a forward direction, wherein the first body hole is located above the second body hole, and
wherein the first body hole or the second body hole is aligned with the speaker in a front-rear direction.

3. The display device of claim 1, wherein the cover is located in front of the cover body, is detachably coupled to the cover body, and comprises a fabric material.

4. The display device of claim 1, wherein the first direction in which the cover body moves is a direction in which the cover body approaches or moves away from the display panel,
wherein the first body hole is disposed closer to the display panel than to the second body hole in the first direction.

5. The display device of claim 4, wherein the cover assembly further comprises a cover base which is coupled to the frame and is movable in the first direction, and to which the cover body is fixed,
wherein the cover base comprises:
a first base hole formed through the cover base in a front-rear direction, and facing the first body hole; and
a second base hole formed through the cover base in the front-rear direction, and facing the second body hole,
wherein a shape of each of the first base hole and the second base hole correspond to a sound outlet of the speaker.

6. The display device of claim 4, wherein the first body hole comprises a plurality of first holes formed through the cover body in a front-rear direction,
wherein the second body hole comprises a plurality of second holes formed through the cover body in the front-rear direction.

7. The display device of claim 6, wherein each of the plurality of first holes is smaller than a sound outlet of the speaker, and
each of the plurality of second holes is smaller than the sound outlet of the speaker.

8. The display device of claim 6, wherein a size of the plurality of second holes is substantially equal to a size of the plurality of first holes.

9. The display device of claim 6, wherein a size of the plurality of second holes is smaller than a size of the plurality of first holes.

10. The display device of claim 9, wherein each of the plurality of first holes comprises:
a first front end having a first diameter; and
a first rear end having a second diameter greater than the first diameter,
wherein each of the plurality of second holes comprises:
a second front end having a third diameter smaller than the first diameter; and
a second rear end having a fourth diameter larger than the third diameter but smaller than the second diameter.

11. The display device of claim 10, wherein the cover body further comprises a protrusion which is formed inside a portion forming a boundary of the second hole of the cover body, and which forms a boundary of an inner hole having a smaller diameter than a diameter of the second hole.

12. The display device of claim 4, wherein the first body hole comprises a plurality of first holes formed through the cover body in a front-rear direction,
wherein the second body hole comprises a plurality of second holes formed through the cover body in a direction intersecting the front-rear direction.

13. The display device of claim 12, wherein a part of a portion forming a boundary of the second hole of the cover body faces the cover.

14. The display device of claim 1, wherein the speaker comprises a pair of speakers spaced apart from each other in a left-right direction, wherein the first body hole comprises a pair of first body holes spaced apart from each other in the left-right direction, and wherein the second body hole comprises a pair of second body holes spaced apart from each other in the left-right direction.

15. The display device of claim 1, further comprising a lift assembly which moves the cover body, wherein the cover opens or closes at least a part of a front surface of the display panel.

\* \* \* \* \*